(12) United States Patent
Takemura et al.

(10) Patent No.: US 7,310,256 B2
(45) Date of Patent: Dec. 18, 2007

(54) SEMICONDUCTOR MEMORY DEVICE

(75) Inventors: Riichiro Takemura, Tokyo (JP);
Satoru Akiyama, Kawasaki (JP);
Satoru Hanzawa, Hachioji (JP);
Tomonori Sekiguchi, Tama (JP);
Kazuhiko Kajigaya, Iruma (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 61 days.

(21) Appl. No.: 11/134,476

(22) Filed: May 23, 2005

(65) Prior Publication Data
US 2005/0265068 A1   Dec. 1, 2005

(30) Foreign Application Priority Data
May 25, 2004   (JP)   ............................. 2004-154753

(51) Int. Cl.
*G11C 5/06* (2006.01)
*G11C 5/08* (2006.01)
*G11C 11/12* (2006.01)
*G11C 11/24* (2006.01)

(52) U.S. Cl. ........................... 365/63; 365/69; 365/72; 365/136; 365/149

(58) Field of Classification Search .................. 365/63, 365/69, 72, 136
See application file for complete search history.

(56) References Cited

U.S. PATENT DOCUMENTS

| 5,262,999 | A | | 11/1993 | Etoh et al. |
| 5,432,733 | A | * | 7/1995 | Furuyama .................... 365/149 |
| 5,646,903 | A | * | 7/1997 | Johnson ................. 365/230.05 |
| 5,923,311 | A | * | 7/1999 | Edwards ....................... 345/92 |
| 6,262,910 | B1 | * | 7/2001 | Takata et al. ................ 365/145 |
| 6,560,136 | B1 | * | 5/2003 | Kumar ........................ 365/104 |
| 6,717,840 | B2 | * | 4/2004 | Kang .......................... 365/149 |
| 2001/0044923 | A1 | * | 11/2001 | Kobayashi et al. ............. 716/1 |

FOREIGN PATENT DOCUMENTS

| JP | 02-246089 | | 3/1989 |
| JP | 2001053164 A | * | 2/2001 |

OTHER PUBLICATIONS

John-Wan Jung et al., "A Fully working 0.14 μm DRAM Technology with Polymetal (W/WNx/Poly-Si) Gate", 2000 IEEE, 4 pages.

* cited by examiner

*Primary Examiner*—Ly Duy Pham
(74) *Attorney, Agent, or Firm*—Reed Smith LLP; Stanley P. Fisher, Esq.; Juan Carlos A. Marquez, Esq.

(57) ABSTRACT

A semiconductor memory device that can achieve high-speed operation or that is highly integrated and simultaneously can achieve high-speed operation is provided. Transistors are disposed on both sides of diffusion layer regions to which capacitor for storing information is connected and other diffusion layer region of each transistor is connected to the same bit line. When access to a memory cell is made, two transistors are activated and the information is read. When writing operation to the memory cell is carried out, two transistors are used and electric charges are written to the capacitor.

21 Claims, 30 Drawing Sheets

SEMICONDUCTOR MEMORY DEVICE

CROSS-REFERENCE TO RELATED APPLICATION

The present application claims priority from Japanese Patent Application No. JP 2004-154753 filed on May 25, 2004, the content of which is hereby incorporated by reference into this application.

TECHNICAL FIELD OF THE INVENTION

The present invention relates to a dynamic semiconductor memory device and specifically to a technique which is effective to be applied for configuration of the storage element portion of the device.

BACKGROUND OF THE INVENTION

For example, in the dynamic random access memory (DRAM), information is stored by accumulating electric charges in a capacitor via memory-cell transistor. In DRAM, the area the memory cell occupies decreases as integration increases and miniaturization advances.

As a conventional DRAM memory cell configuration, for example, the following one can be mentioned set forth in: Jong-Wan Jung and seven others: A fully working 0.14 μm DRAM technology with polymetal (W/WNx/Poly-Si) gate), "IEDM (International Electron Devices Meeting) 2000 Technical Digest," p. 365-368. That is, the memory cell configurations shown in FIG. 28 through FIG. 30 are available. FIG. 28 is a drawing of one example showing memory cell layout configuration in semiconductor memory devices of conventional technologies studies as the premise of the present invention. FIG. 29 is a drawing of one example showing cross-sectional configuration taken on line A-A' of FIG. 28. FIG. 30 is a drawing of an equivalent circuit of FIG. 28. As shown in FIG. 30, DRAM according to the conventional technology has a memory cell MC at a desired intersection between a word line WL and a bit line BL in a memory cell array MCA, and one memory cell MC comprises one memory cell transistor M1 and one capacitor Cs.

The layout of memory cell MCA has diffusion layer regions DIFF, respectively, between two gates GM which become the word lines WL and on both sides in an island-shape active region AA as shown in FIG. 28. Of these, the diffusion layer region DIFF between two gates GM (word lines WL) is connected to bit line BL via bit-line contact BC. On the other hand, the diffusion layer regions DIFF on both sides of two gates GM are storage nodes SN and are connected to capacitors CAP (not illustrated) via storage node contacts SC.

The portion other than this active region AA is the isolation region STI formed with insulator. By this, the diffusion layer region DIFF (SN) which becomes storage node SN has the three sides excluding the side that comes in contact with the bit line contact BC of the four sides which form the boundary section covered with the isolation region STI. In addition, the cross-sectional structure of memory cell array MCA has two gates GM (word wires WL) between adjacent capacitors CAP as shown in FIG. 29, and the clearance between two diffusion layer regions DIFF (SN) that form two memory cell storage nodes SN is separated by the isolation region STI.

The memory cell layout shown in FIG. 28 is used in the configuration of so-called folded bit line. With respect to the size of the memory cell MC, let ½ the word line pitch be the feature size F; then, both gate length and gate width W are F and the memory cell area S is expressed by S=4F (W+F). Consequently, when the gate size of memory cell transistor M1 is increased, the memory cell area S is increased by $4F^2$ each as the memory cell transistor gate width W is increased by F each, and the chip area increases accordingly.

SUMMARY OF THE INVENTION

As a result of investigation of the present inventors on the DRAM technologies as described above, the following have been clarified.

For example, in DRAM, it is necessary to achieve increased integration and at the same time to achieve high-speed operation. For high-speed operation, it is important to increase speeds of reading electric charges from the memory cell capacitor and writing electric charges in the memory cell capacitor.

Under the circumstances, for example, in the memory cell of a folded bit line configuration as described in the Background of the Invention, the gate size and gate width of a memory cell transistor are reduced as the lithography technology advances, and the memory cell area is reduced. For this area reduction, reduction of the capacity of the capacitor to store information is suppressed to a minimum by adopting new material, making the capacitor three-dimensional, and others. By these contrivances, the information retention time continues to be maintained to the performance equal to the conventional level.

On the other hand, because with respect to the memory cell transistor, from the viewpoint of leakage prevention of capacitor accumulated electric charges, the threshold voltage cannot be lowered, the word line swing voltage cannot be lowered and reduction of gate oxide thickness cannot be undertaken, even if miniaturization advances. Consequently, as miniaturization advances, current drivability lowers. As a result, when the specified electric charge amount is written in the memory cell capacitor, or accumulated electric charges are read from the memory cell capacitor, problems of increased writing time and increased reading time occur.

To be more specific, the relationship between current drivability of memory cell transistor and access time and cycle time can be explained in the write operation and the read operation. In DRAM, unlike a precharge operation after read operation, the precharge command after write operation must be entered after it waits at the recovery time. This is to secure time for definitely write the write data in the memory cell. This write recovery time increases as current drivability of memory cell transistor lowers. In addition, as the write recovery time is increased, the cycle time increases. In particular, in the event that the memory cell transistor is configured with NMOS transistors, high voltage is applied to the memory cell capacitor and operation to store 'H' delays.

On the other hand, in the read operation, the speed to read electric charges of memory cell capacitor into the bit line strongly depends on current drivability of memory cell transistor. As drivability lowers, the time for reading memory cell data to the bit line increases, and access time and cycle time become longer.

Consequently, in order to achieve high-speed access and short cycle time, current drivability of memory cell transistor must be improved. To improve current drivability of memory transistor, there are methods to increase the gate voltage as well as to increase the memory cell transistor size. However, increased gate voltage degrades reliability of miniaturized transistors, and increased chip area results because the scale of the charge pump circuit increases.

These and other objects and features of the present invention will become more apparent upon a reading of the following detailed description and drawing.

Of the inventions disclosed in the present application, the outline of typical ones can be briefly described as below.

A semiconductor memory device according to the present invention comprises: a bit line; a first transistor and a second transistor disposed in the direction in which the bit line extends; a capacitor element which holds information; the first transistor having a first node shared by a first node of the second transistor, wherein one end of the capacitor element connected thereto in common; and a second node of the first transistor and a second node of the second transistor being connected independently to the bit line, respectively.

That is, the semiconductor memory device according to the present invention has a configuration in which two memory cell transistors comprising a first transistor and a second transistor are connected in parallel across the bit line and capacitor element. Using these two memory cell transistors for reading/writing in and from a capacitor element enables the improvement of current drivability.

Now, to the gate of the first transistor and the gate of the second transistor, for example, the first word line and the second word line are connected, respectively. And at the time of operation, these word lines may be activated simultaneously or with time delay provided.

Further, a semiconductor memory device according to the present invention comprises: a bit line; multiple first diffusion layer regions disposed in parallel with the bit line; multiple second diffusion layer regions disposed one by one between relevant multiple first diffusion layer regions; multiple capacitors connected to multiple second contacts, respectively; and multiple word lines disposed one by one between the multiple first diffusion layer regions and the multiple second diffusion layer regions, respectively, and extending in the direction that intersects with the bit line.

Further, a semiconductor memory device according to the present invention comprises: multiple bit lines; multiple capacitors that store information; multiple word line pairs that extend in the direction to intersect with the multiple bit lines and disposed in plural sets of two lines in the direction in which multiple bit lines extend; multiple active regions disposed in parallel to the multiple bit lines, respectively and equipped with a shape continuing in the direction in which the multiple bit lines extend; multiple second diffusion layer regions formed between two word lines included in the multiple word line pairs, respectively, and in the vicinity of the intersection with multiple active regions; multiple first diffusion layer regions formed between the multiple word line pairs and in the vicinity of the intersection with the multiple active regions; multiple first contacts connected to multiple bit lines, respectively, and formed in the multiple first diffusion layer regions, respectively; and multiple second contacts connected to multiple bit lines, respectively, and formed in the multiple second diffusion layer regions, respectively.

That is, the semiconductor memory device according to the present invention has the first diffusion layer region connected to the bit line and the second diffusion layer region connected to the capacitor are alternately disposed towards the bit line direction and has a configuration such that the word lines are provided between these diffusion layer regions. And these first diffusion layer regions and second diffusion layer regions are formed on the activated region which has a continuous shape in the bit line direction, and the first diffusion layer region is shared between adjacent memory cells.

By this kind of configuration, for the capacitor element as described above, a configuration in which two memory cell transistors are connected in parallel can be achieved as a memory cell array configuration. And this memory array configuration is best-suited for increased integration. In addition, by making the shape of the active region and bit line, for example, triangular wave shaped which is continued in the bit line direction, the configuration of arrangement that can secure the capacitor area can be secured.

Furthermore, in the event that the memory array is configured, in the vicinity of the above-mentioned memory cell array configuration, for example, the first word driver group, second word driver group, and so on are equipped, respectively, above and below the memory cell array and the first sense amplifier group, second sense amplifier group and so on at its side. And gate voltage of two memory cell transistors in the memory cell array can be supplied in various combinations using the first word driver group and the second word driver group.

For example, the gate voltage can be supplied to each one of the two memory cell transistors from the first word driver group and the second word driver group, or to both two memory cell transistors from either one of the word driver groups. Because by these combinations, the drivability of word line or circuit area of word driver group, easiness of the process, etc. are varied, the optimum combinations should be chosen as required.

And the configurations discussed by now will become the most appropriate when they are applied to DRAM of so-called open system bit line configuration, DRAM of twin cell array system, etc.

Briefly explaining the effects obtained by typical inventions of those disclosed in this application can achieve high-speed operation or increased integration of semiconductor memory devices.

BRIEF DESCRIPTIONS OF THE DRAWINGS

Figure 1:
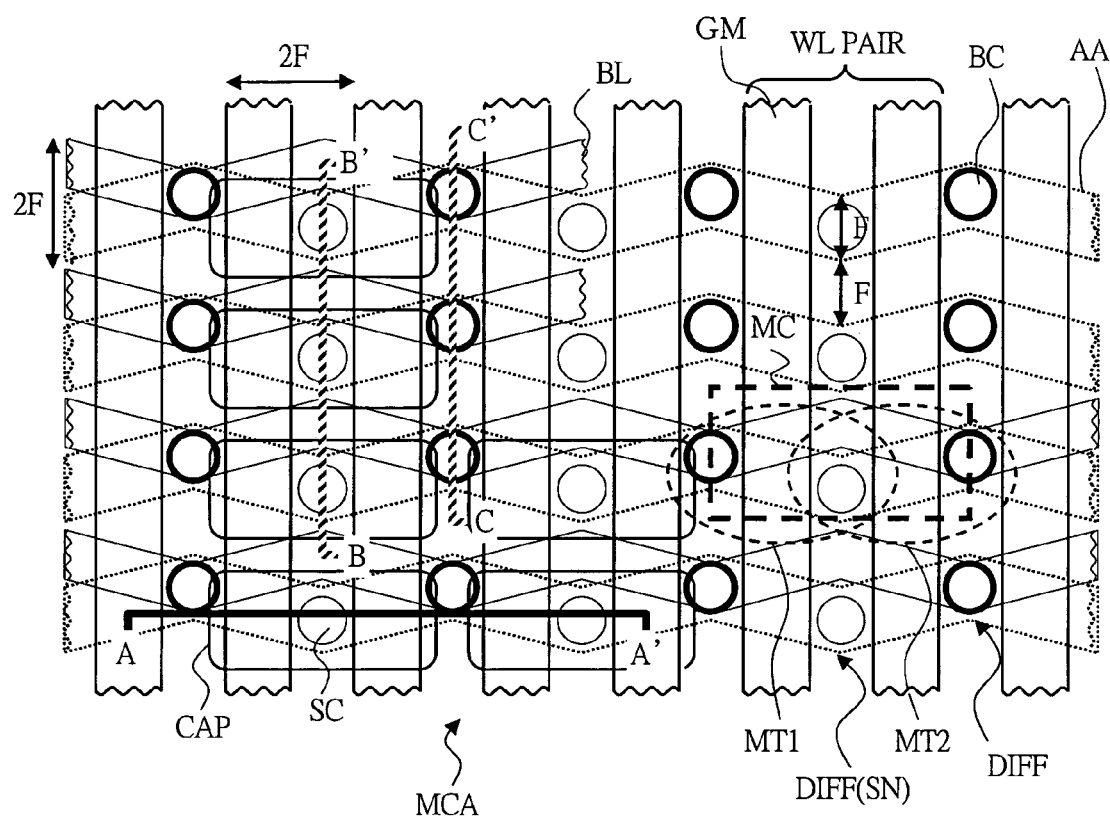
FIG. 1 is a layout drawing showing one example of the memory cell layout in a semiconductor memory device according to embodiment 1 of the present invention.
Figure 4:
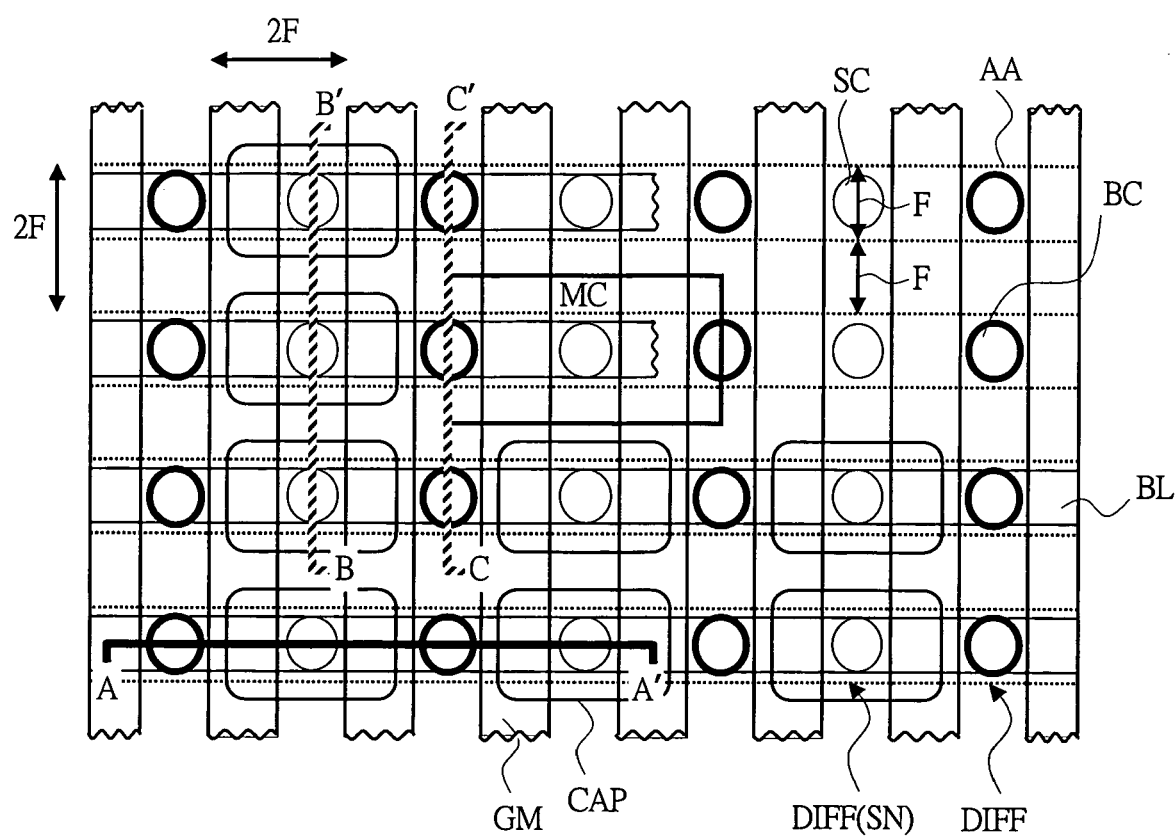
FIG. 4 is a layout drawing showing one example of the memory cell layout in a semiconductor memory device according to embodiment 3 of the present invention.
Figure 5:
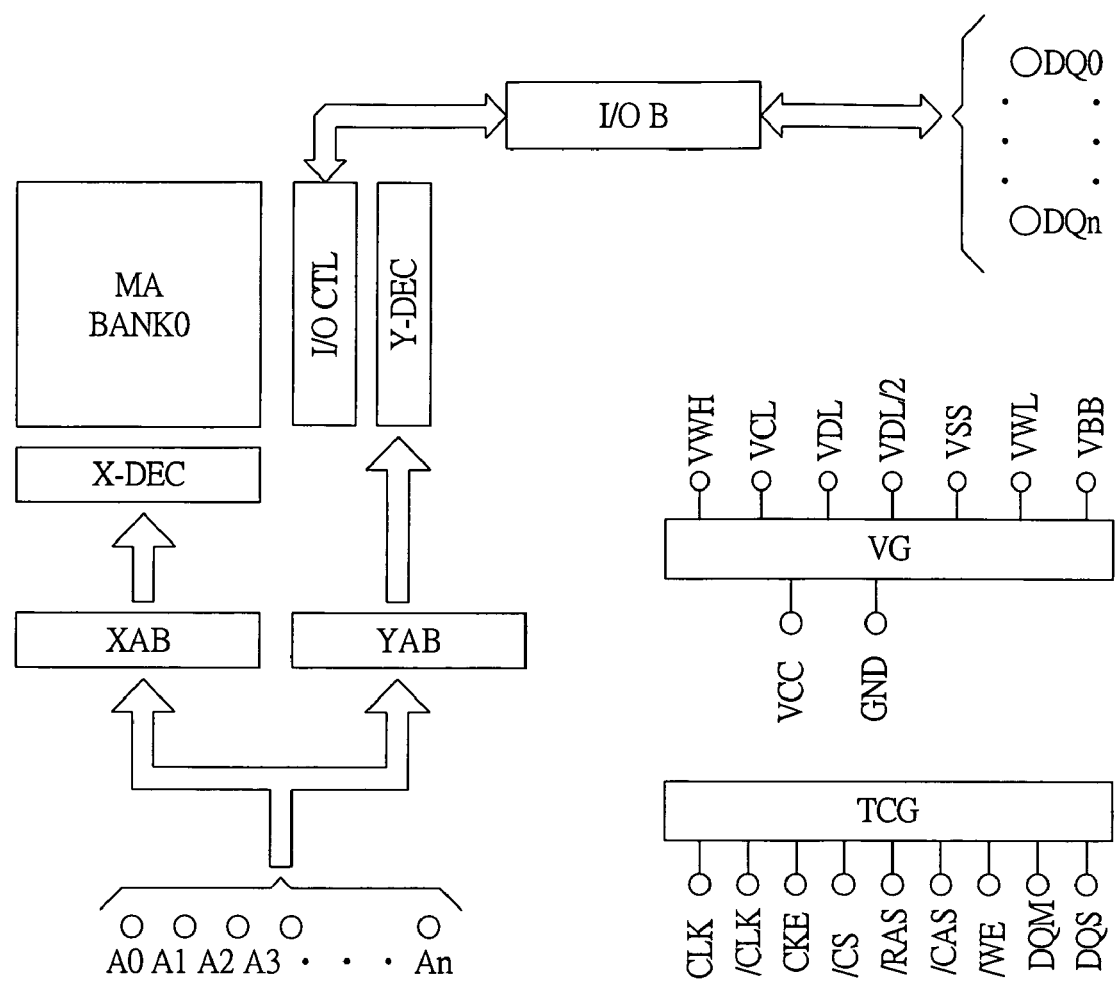
Figure 6:
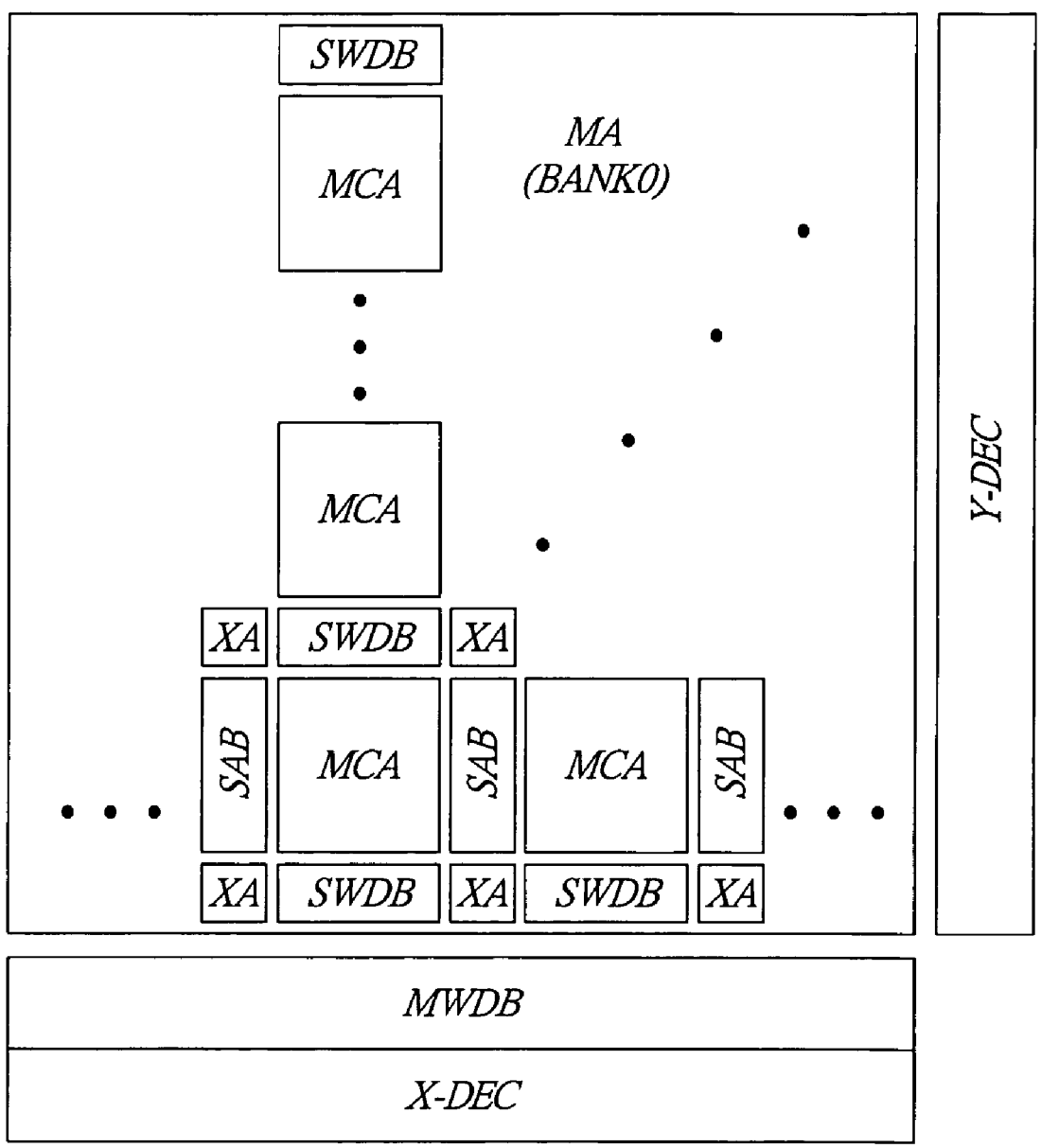
Figure 7:
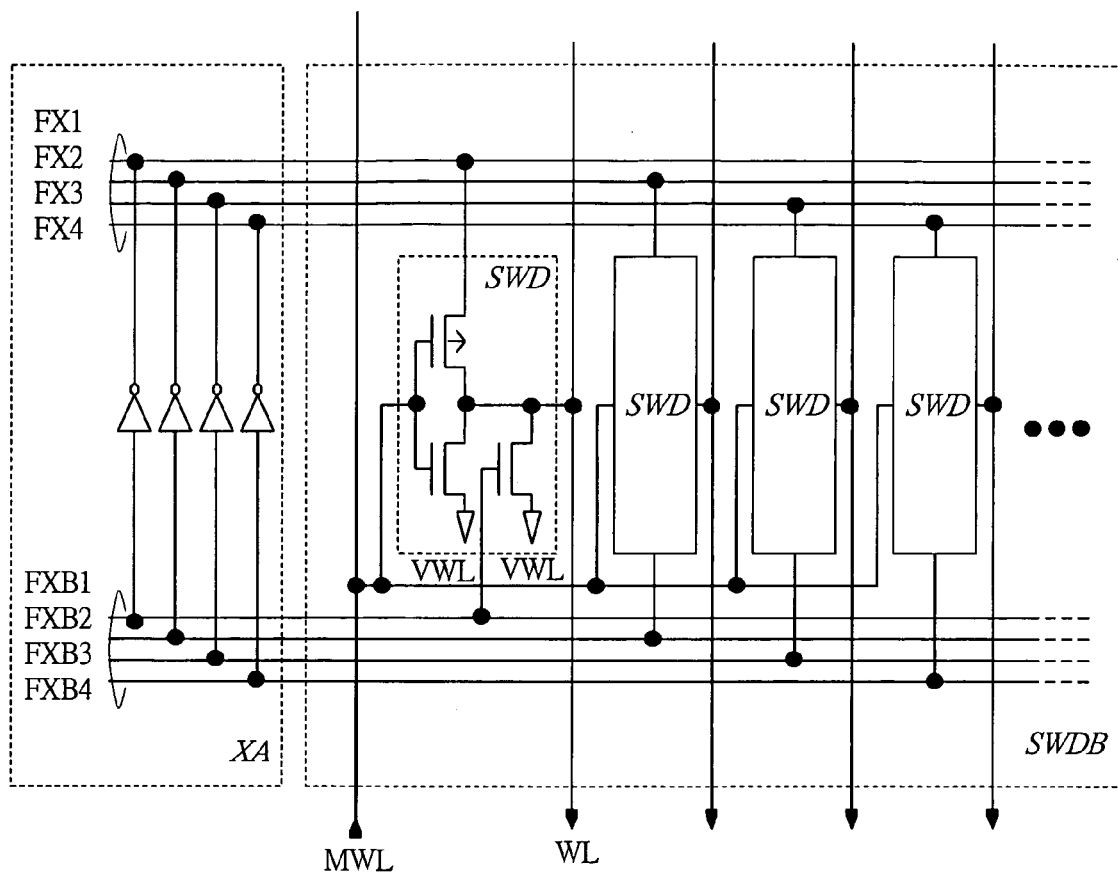
Figure 8:
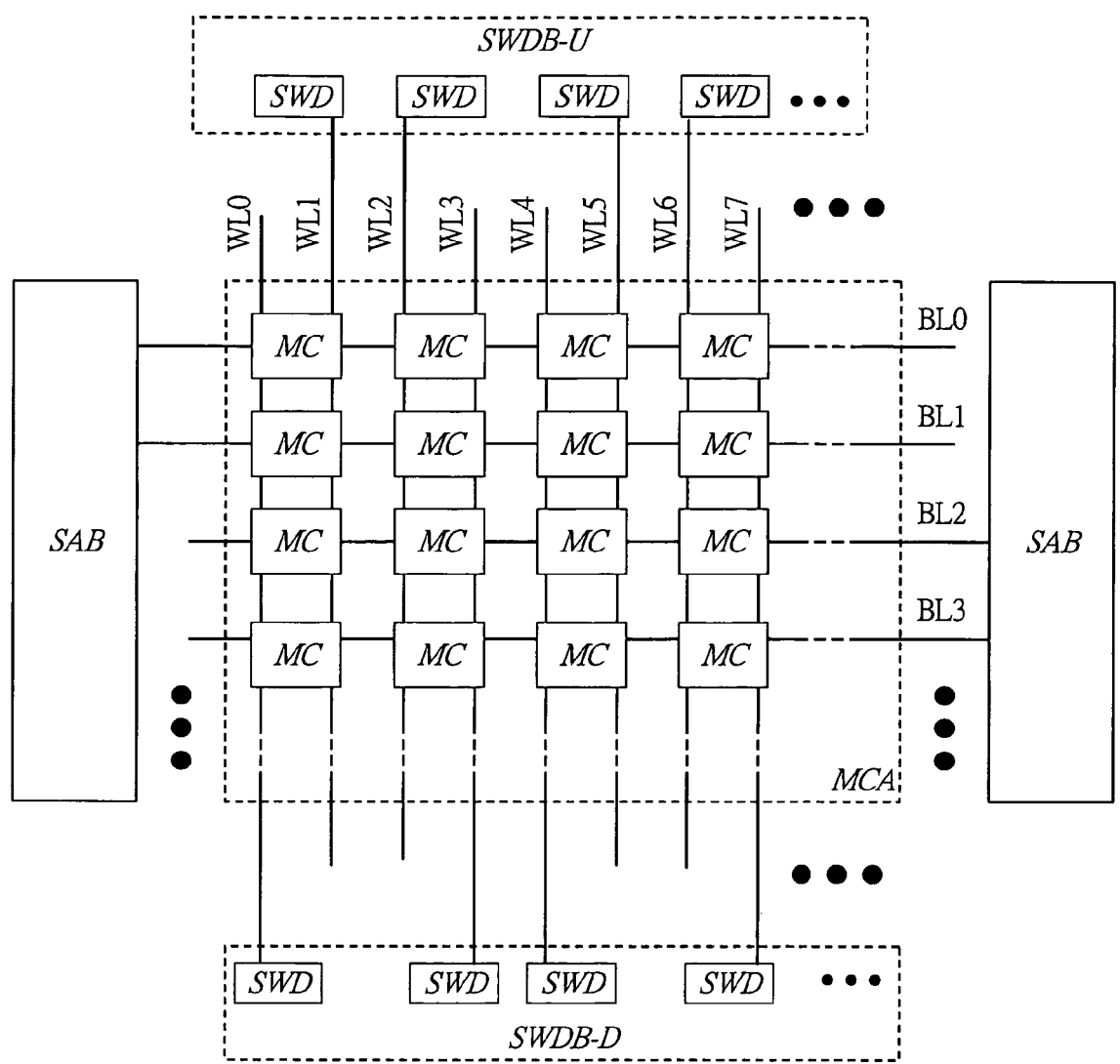
Figure 9:
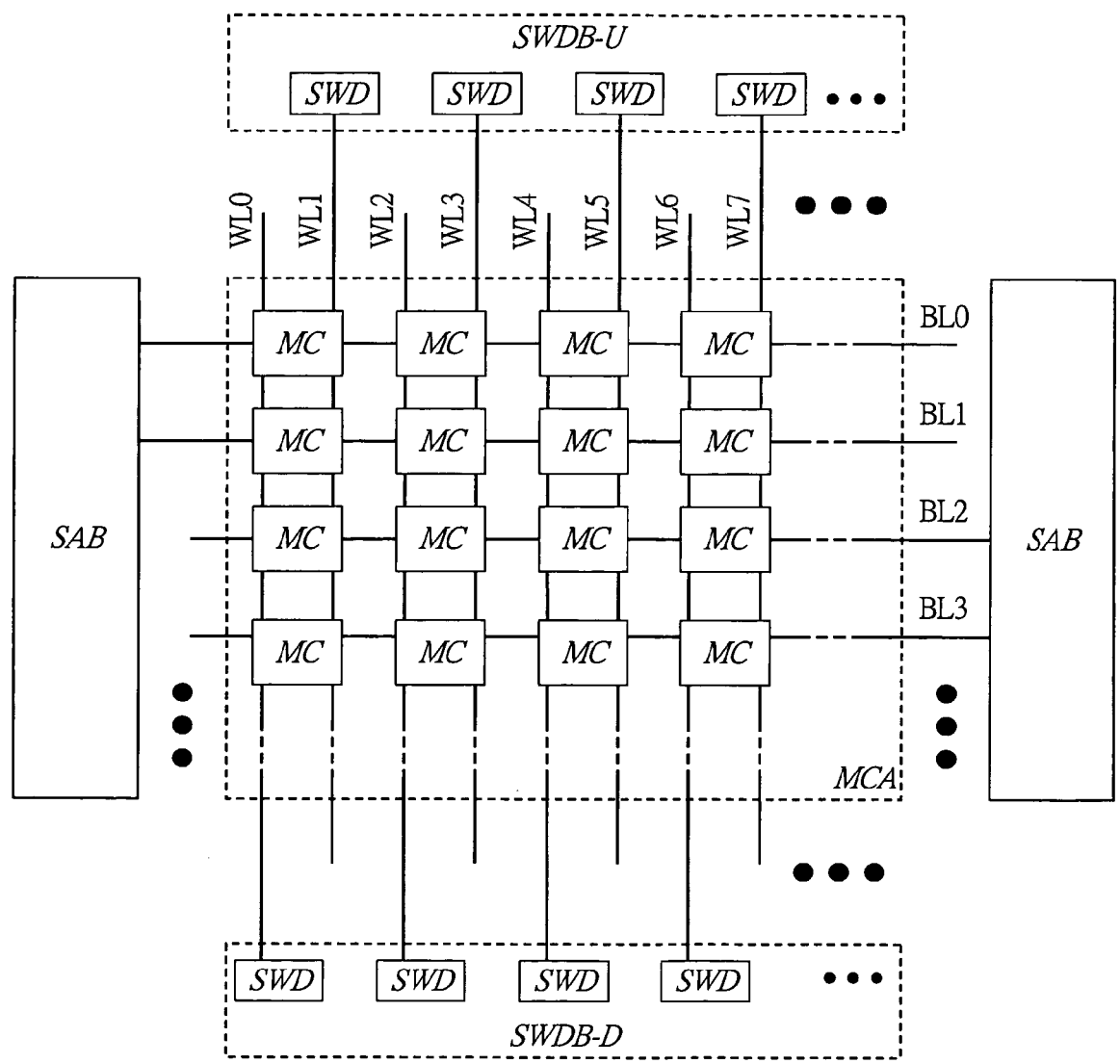
Figure 10:
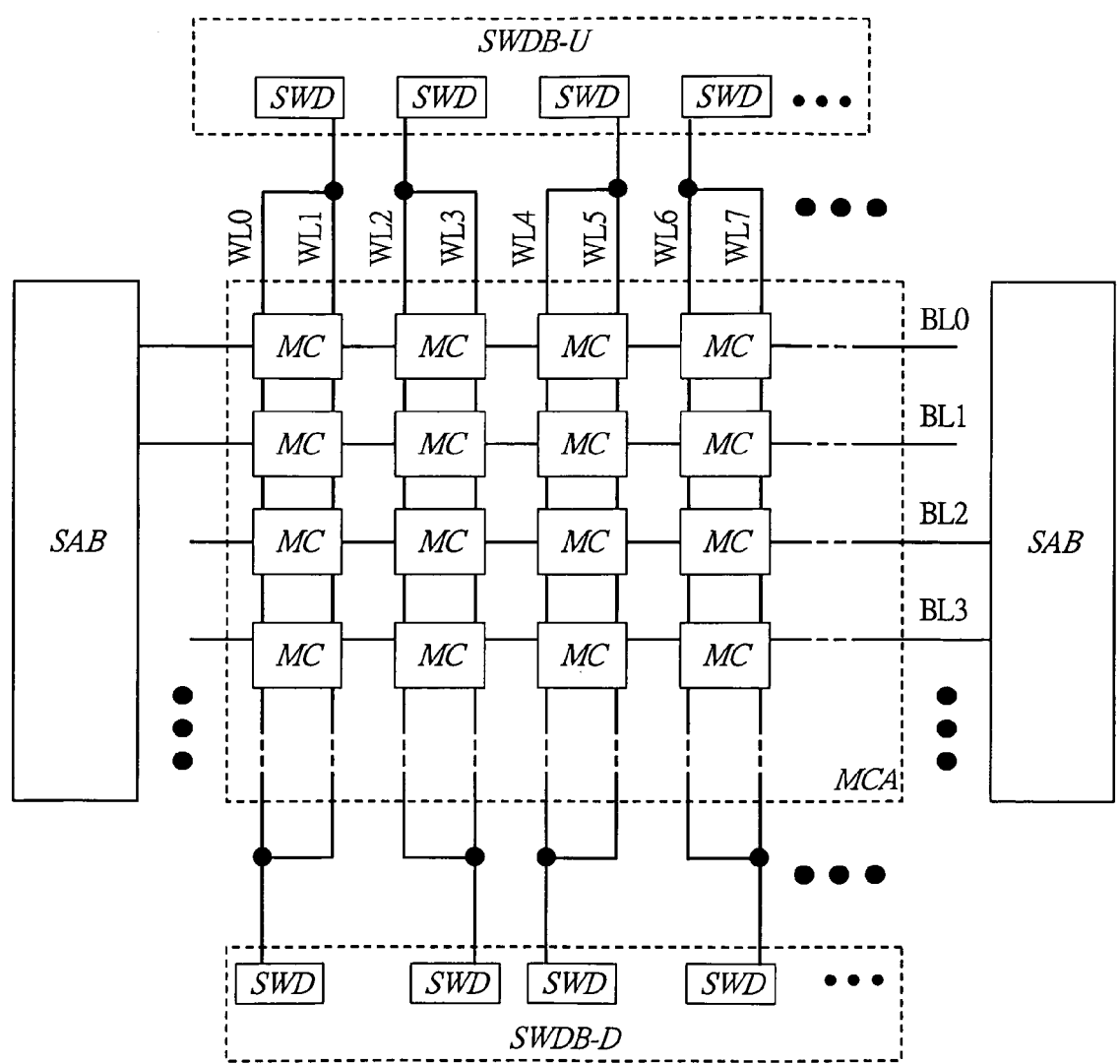
Figure 11:
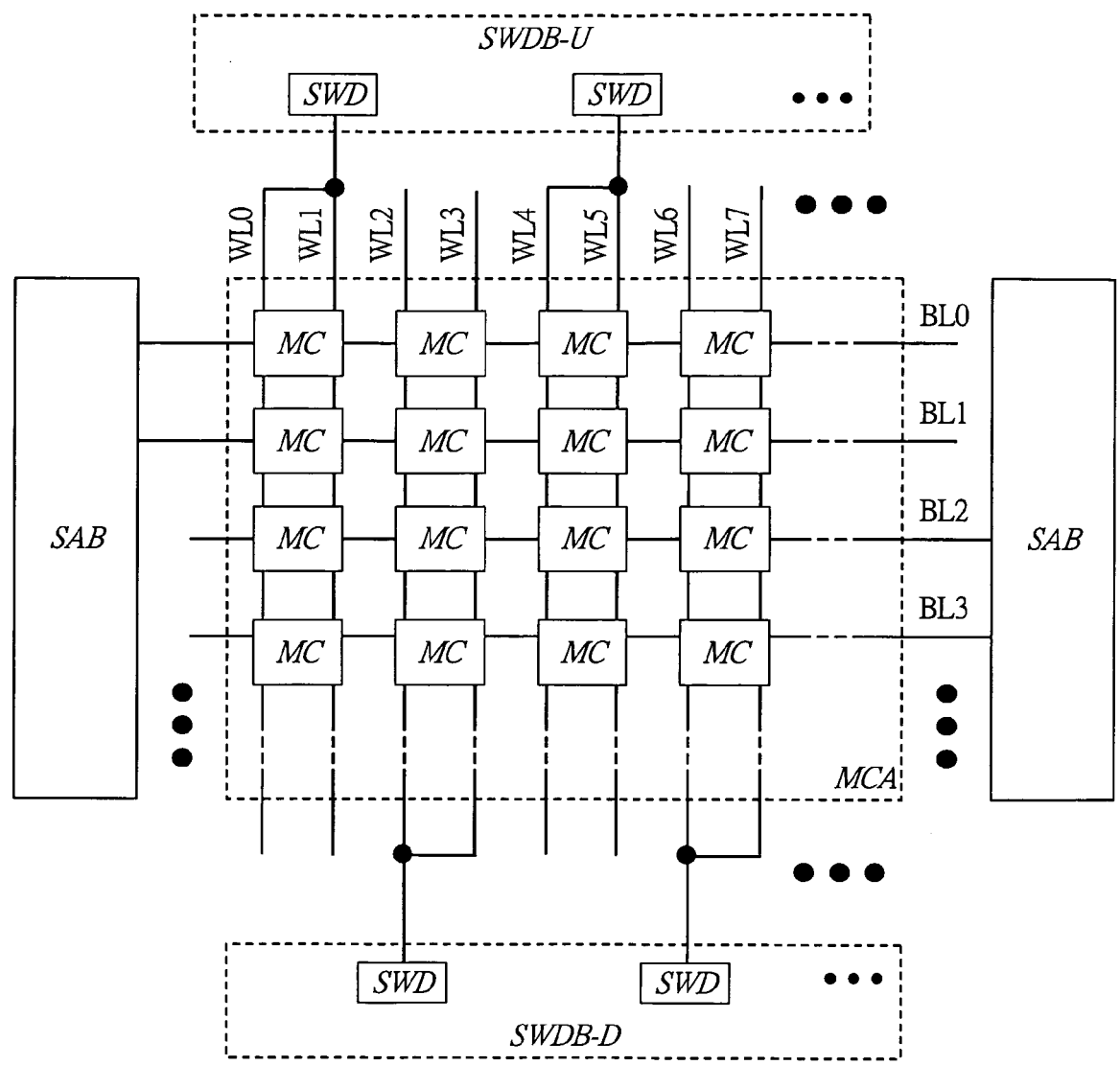
Figure 12:
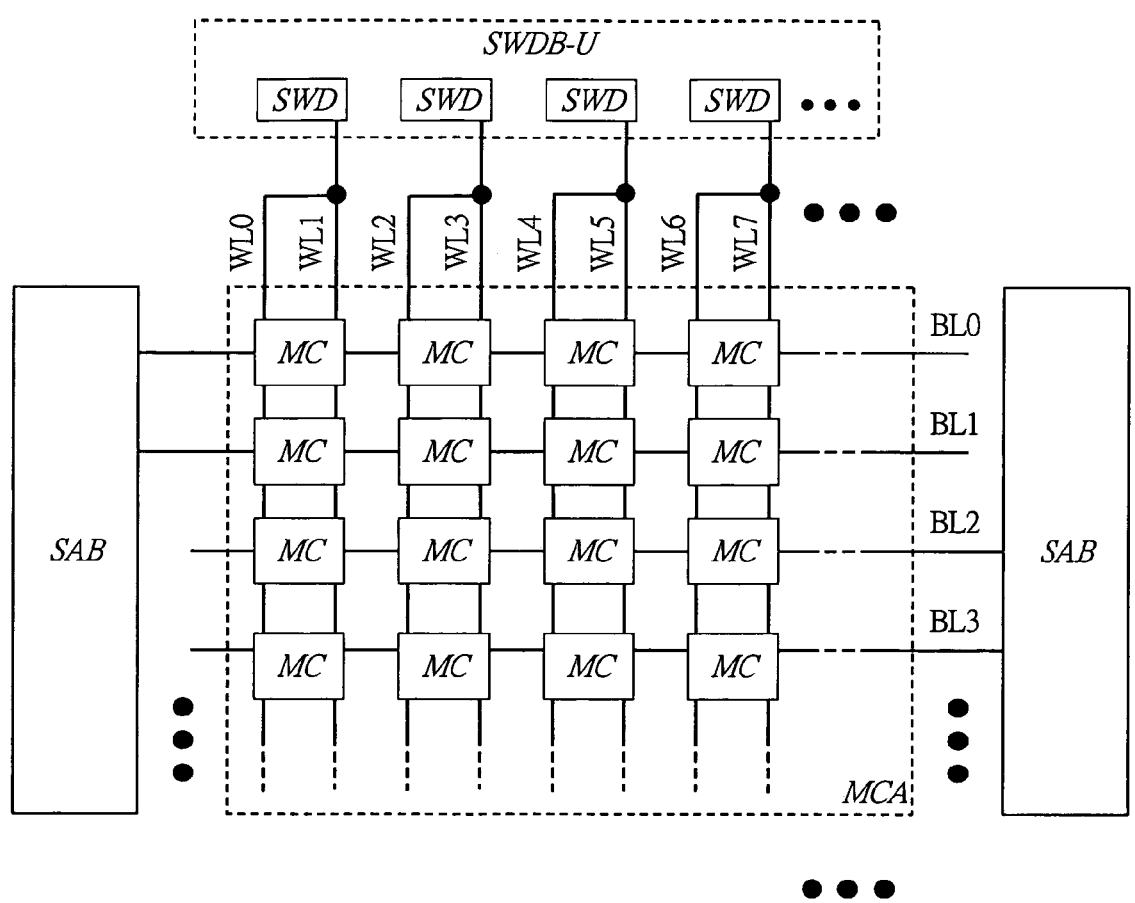
Figure 13:
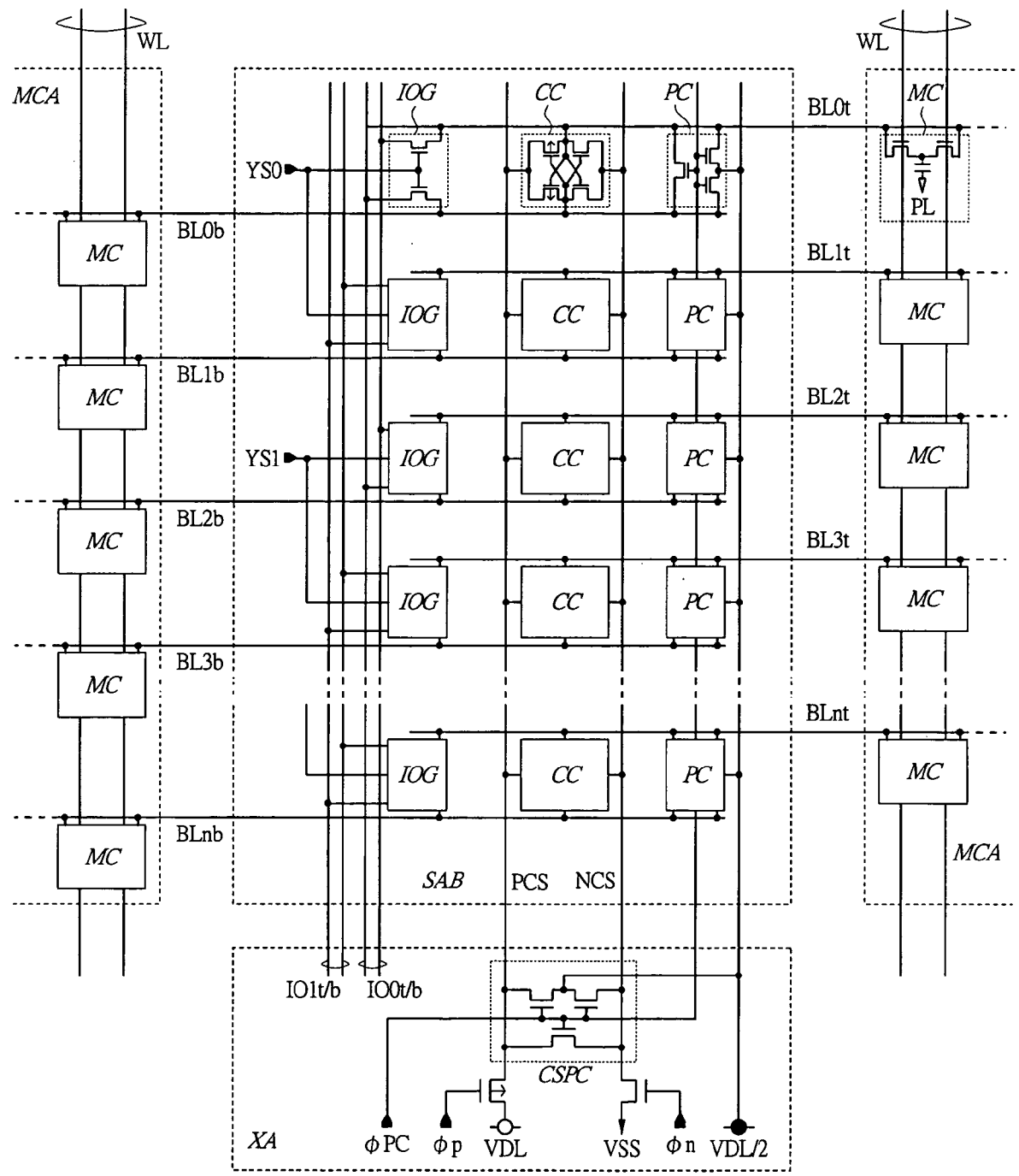
Figure 14:
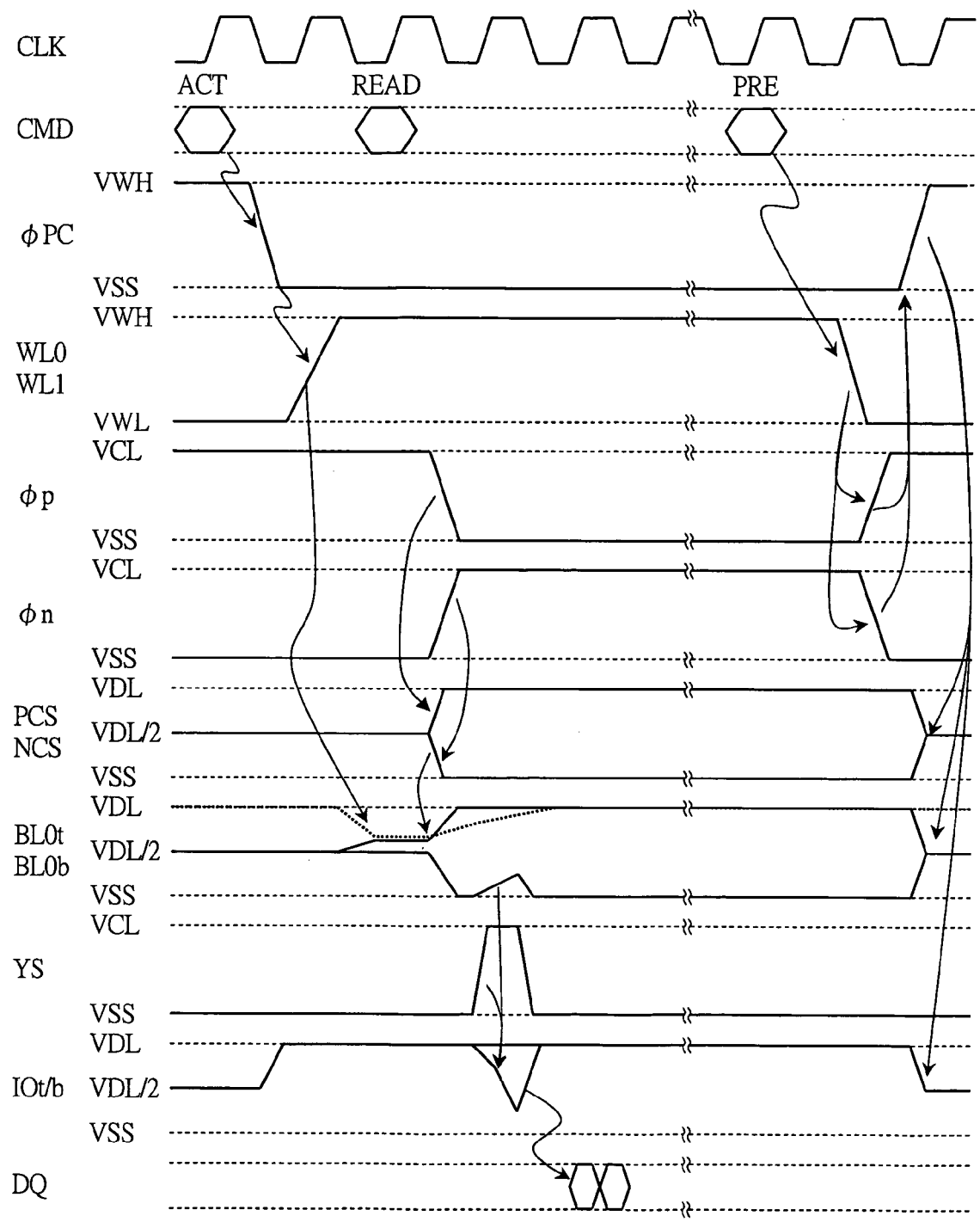
Figure 15:
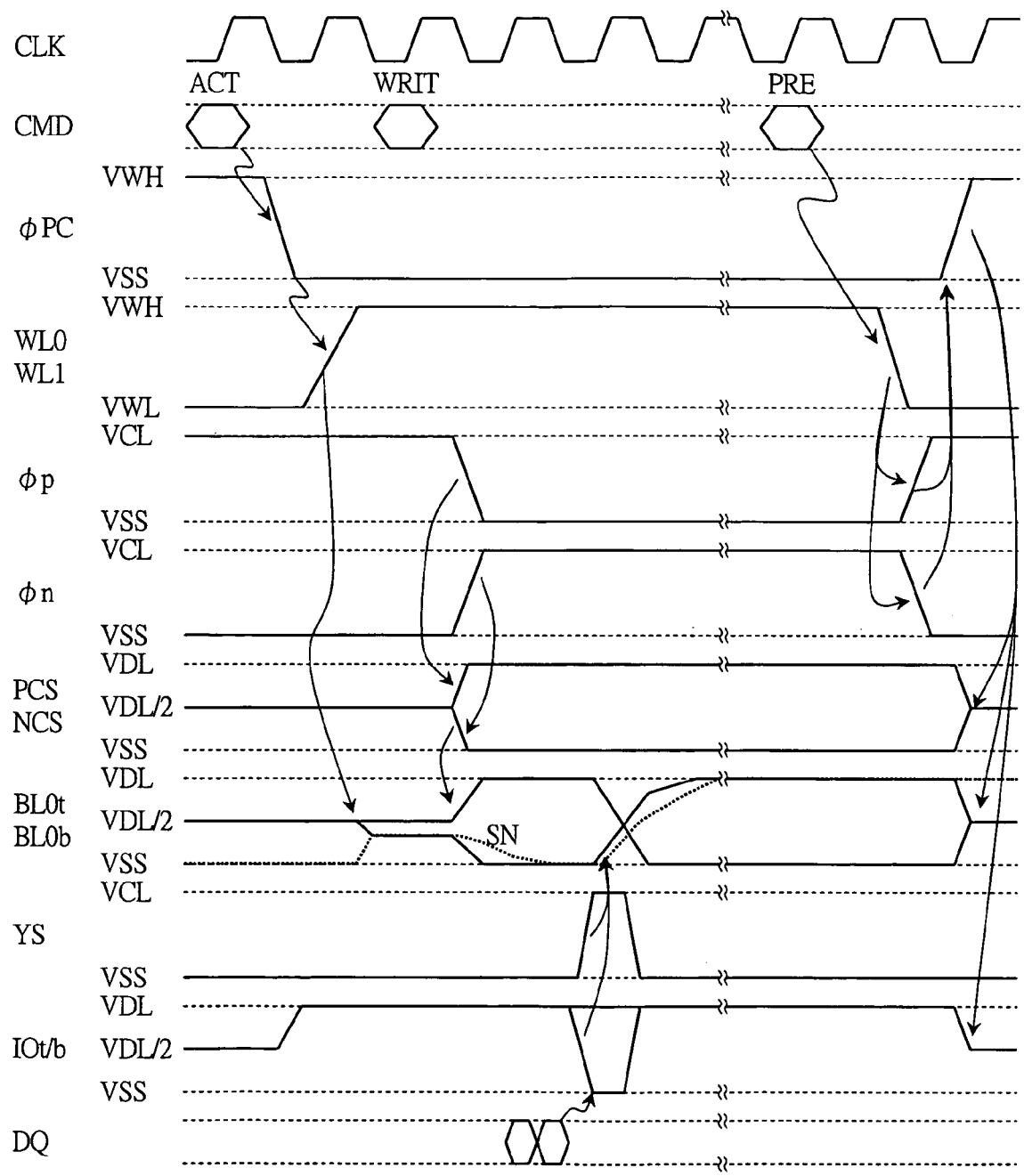
Figure 16:
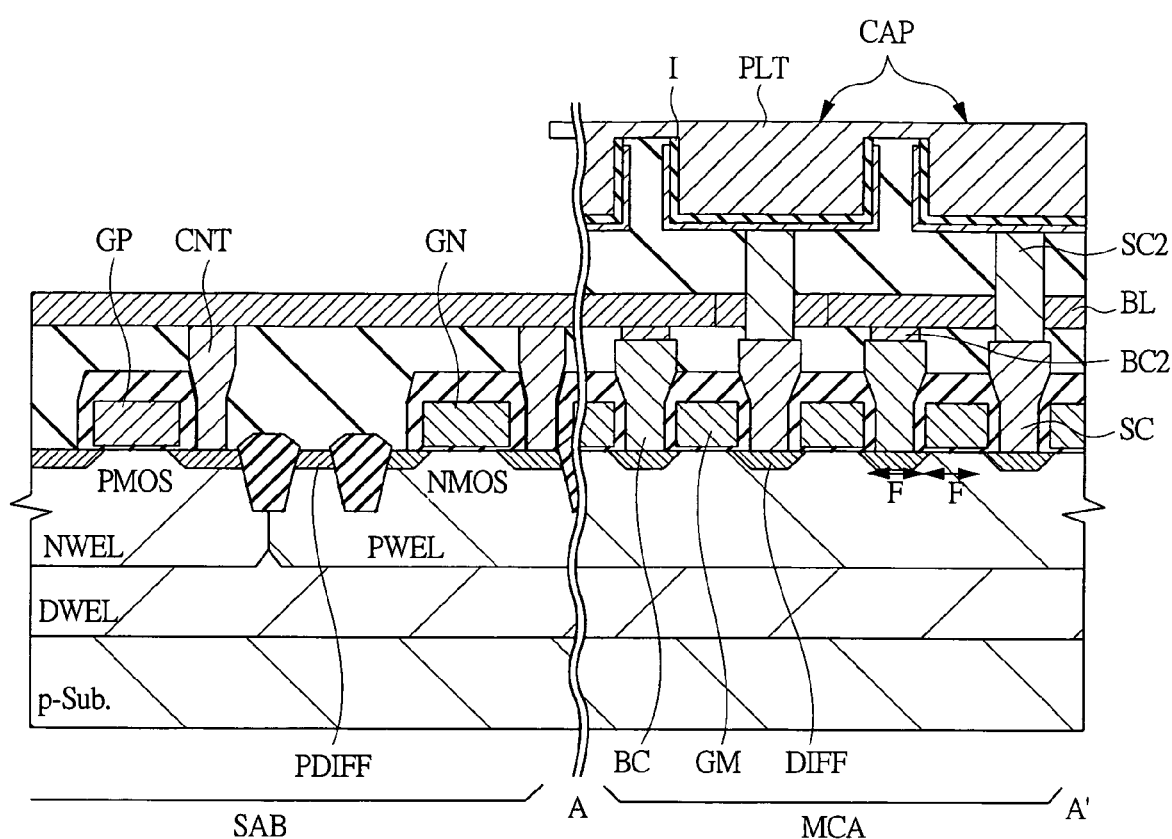
Figure 17A:
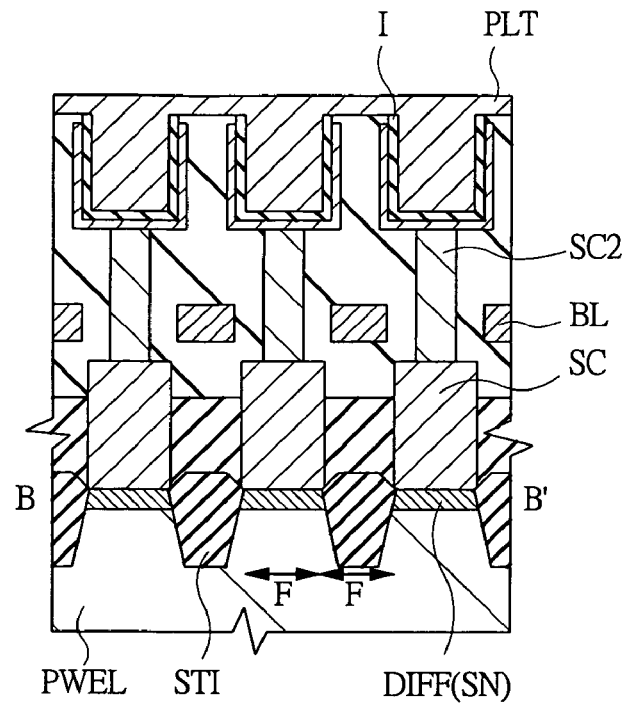
Figure 17B:
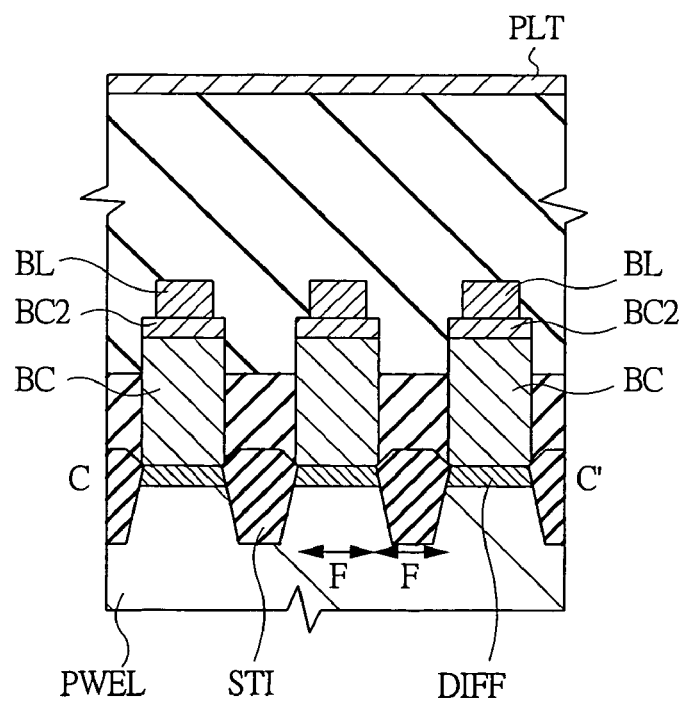
Figure 18:
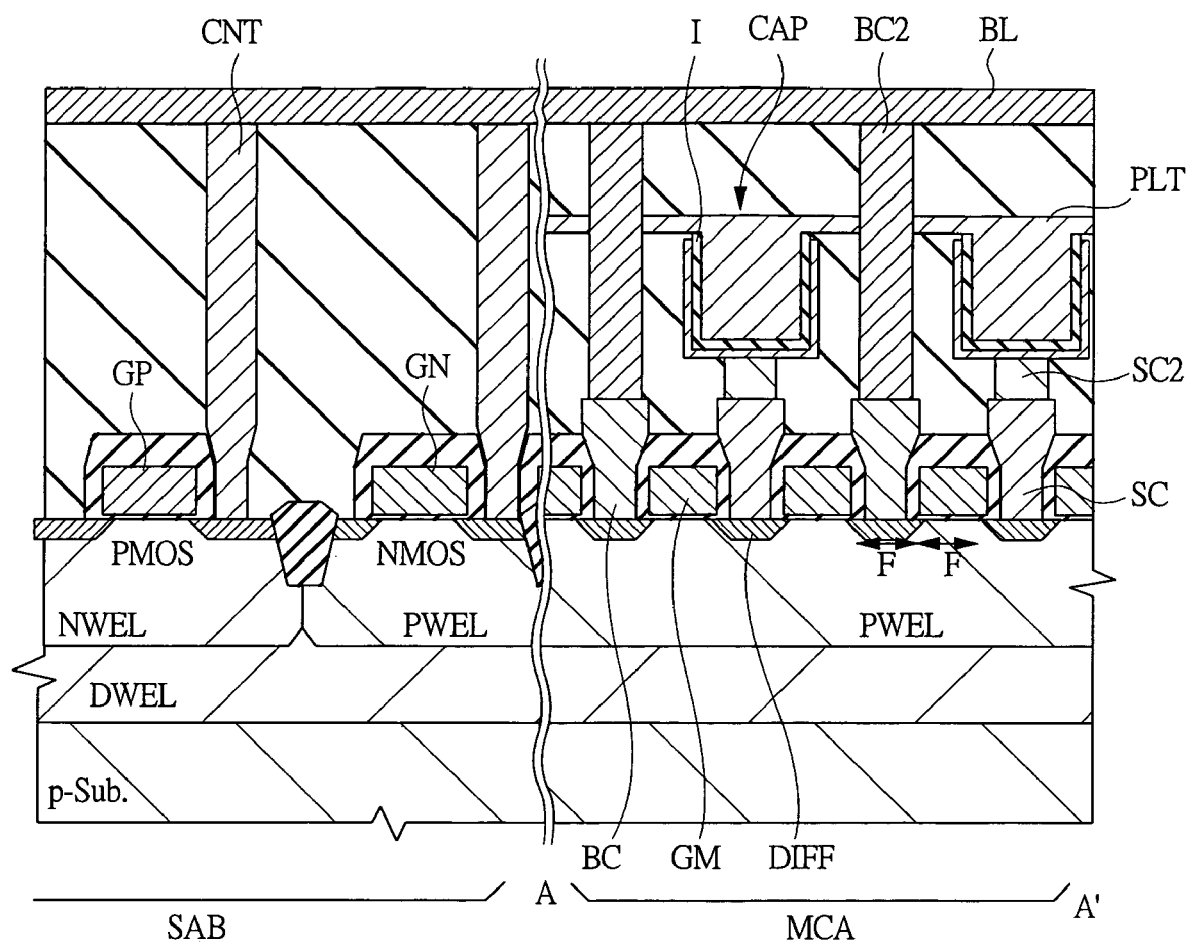
Figure 19A:
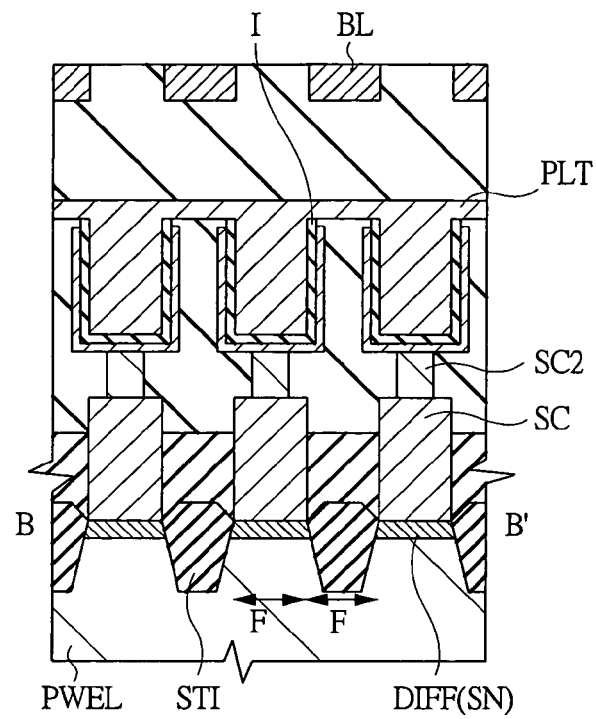
Figure 19B:
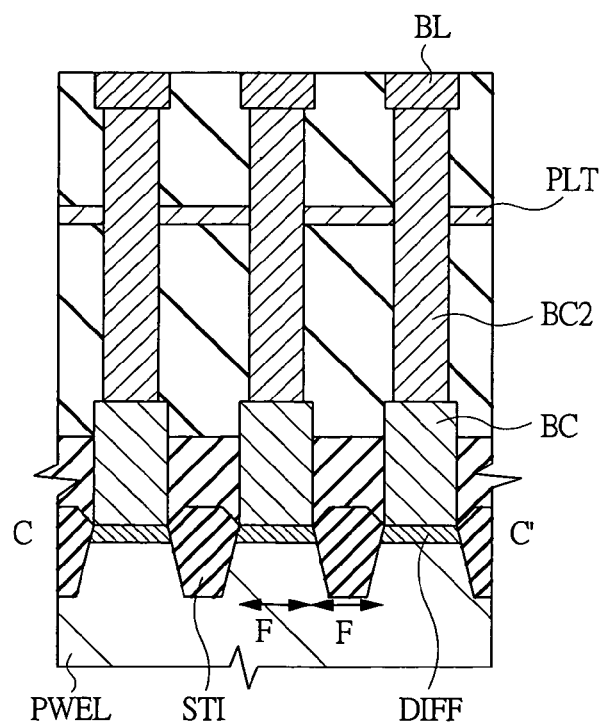
Figure 20:
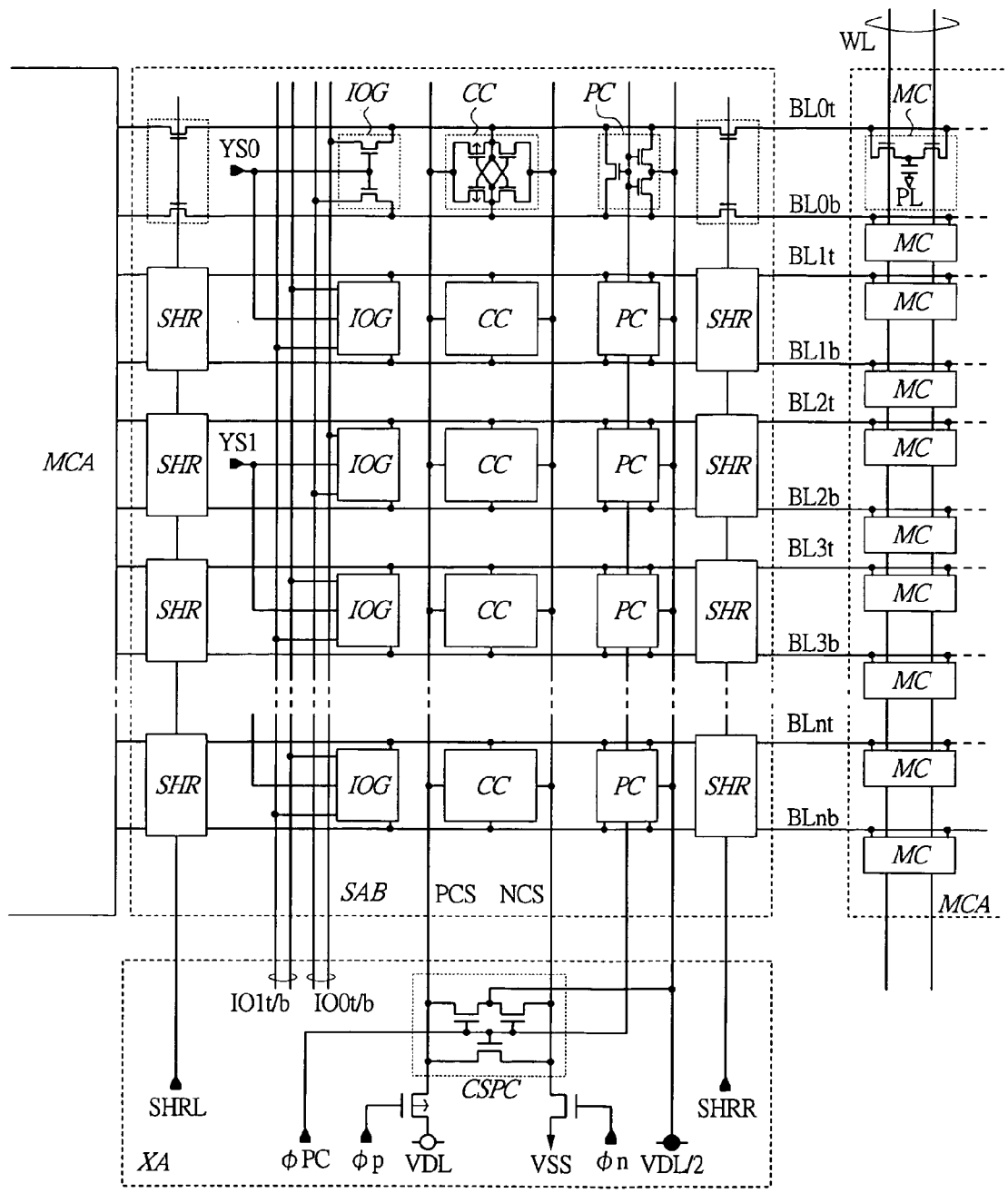
Figure 21:
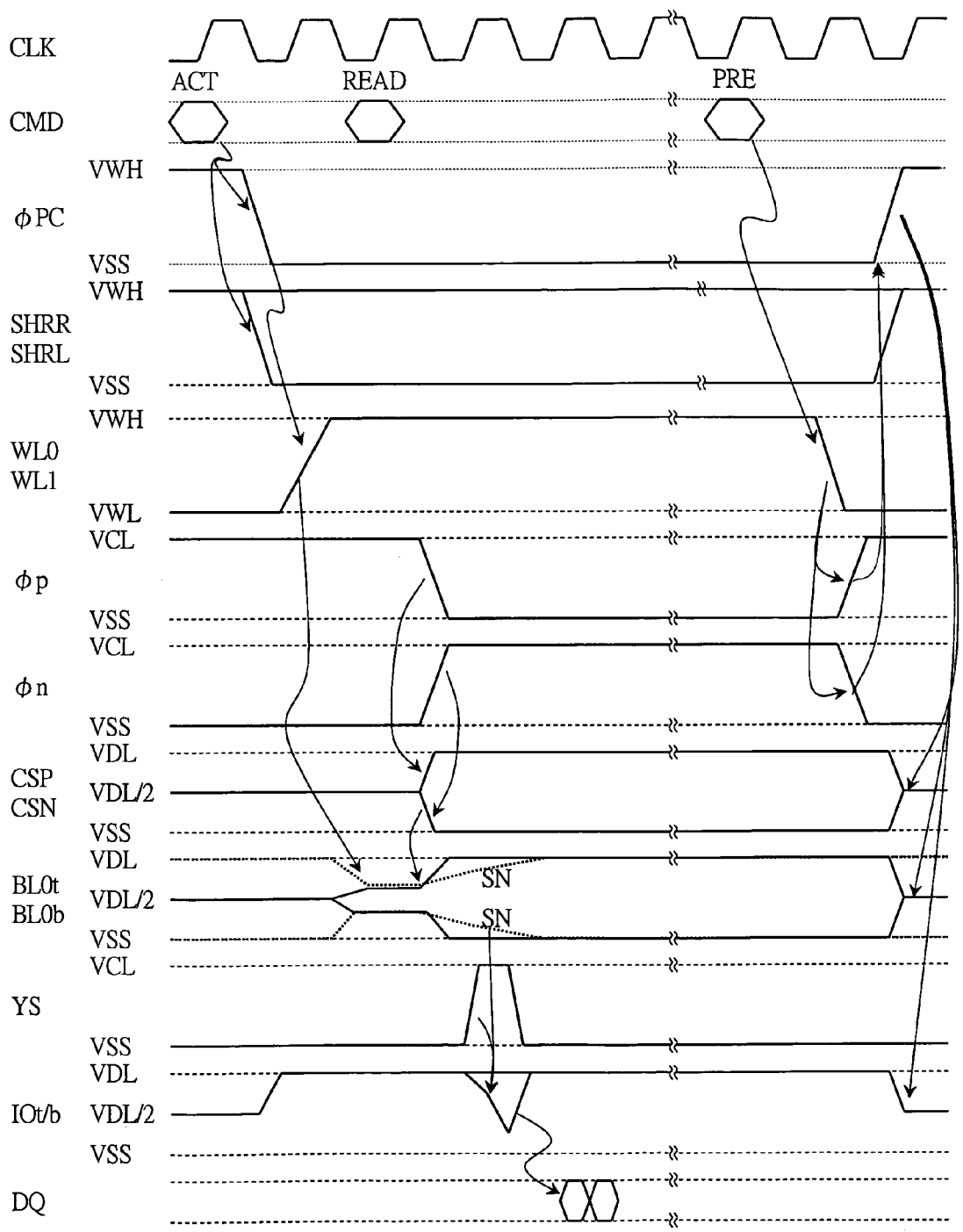
Figure 22:
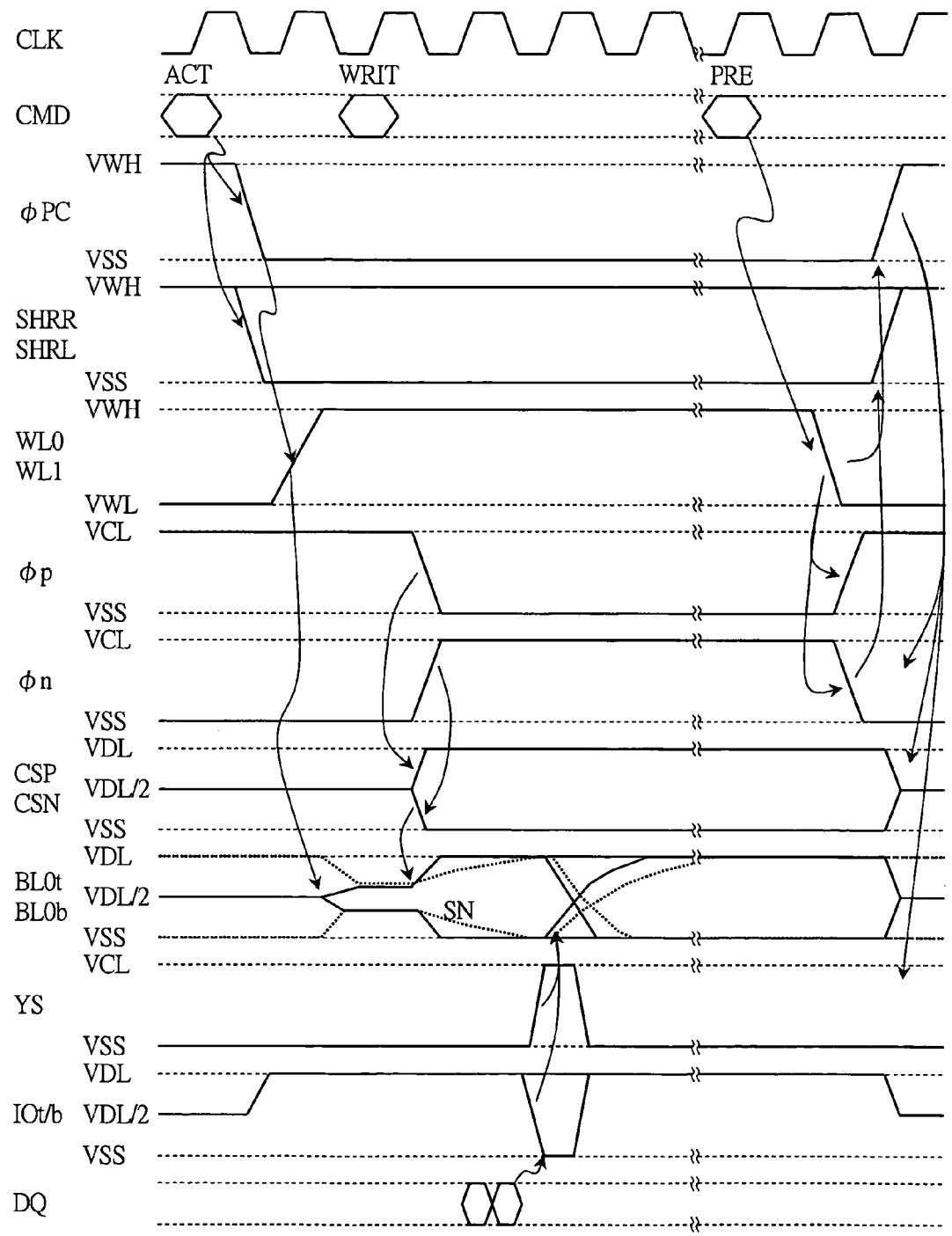
Figure 23:
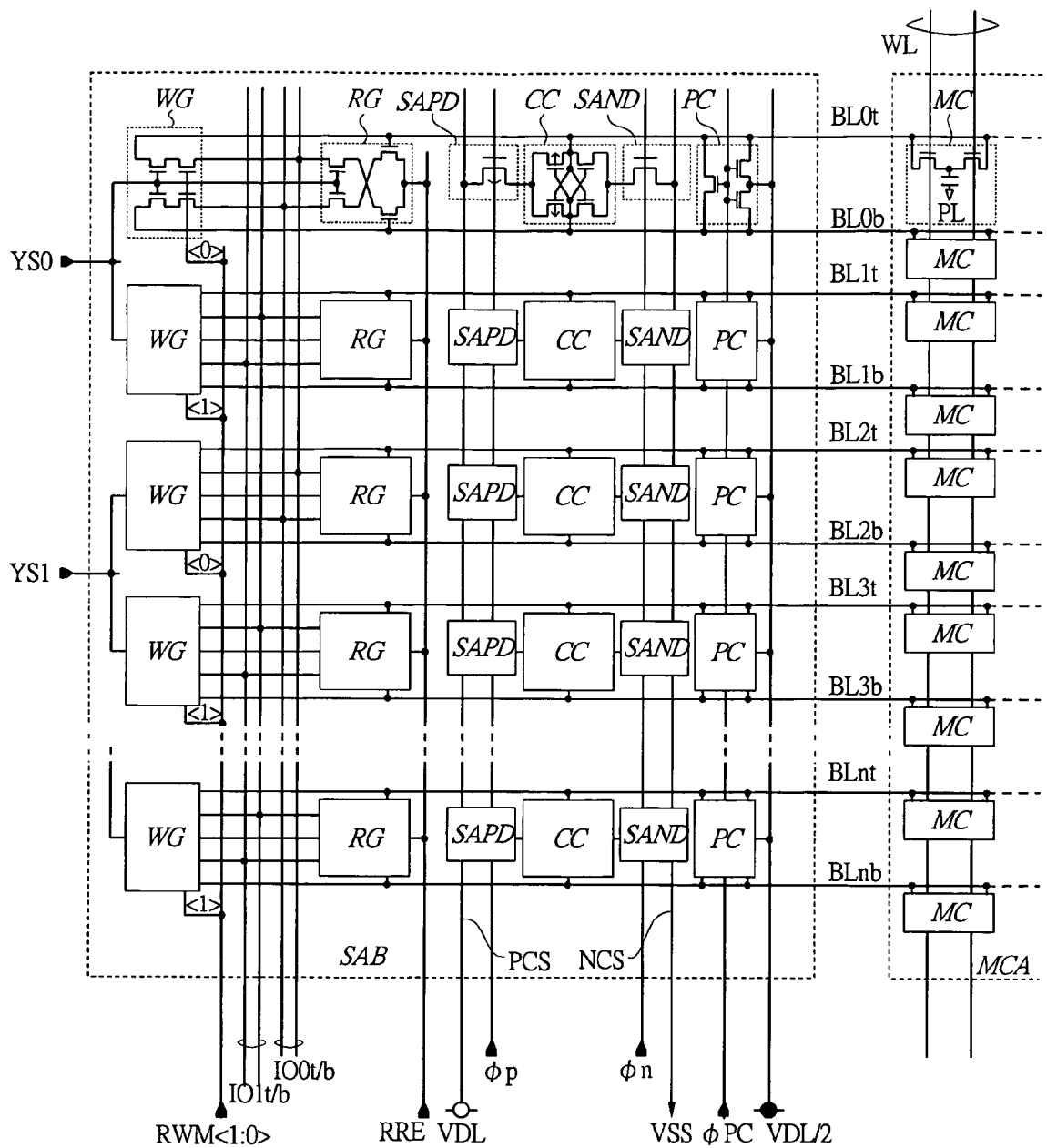
Figure 24:
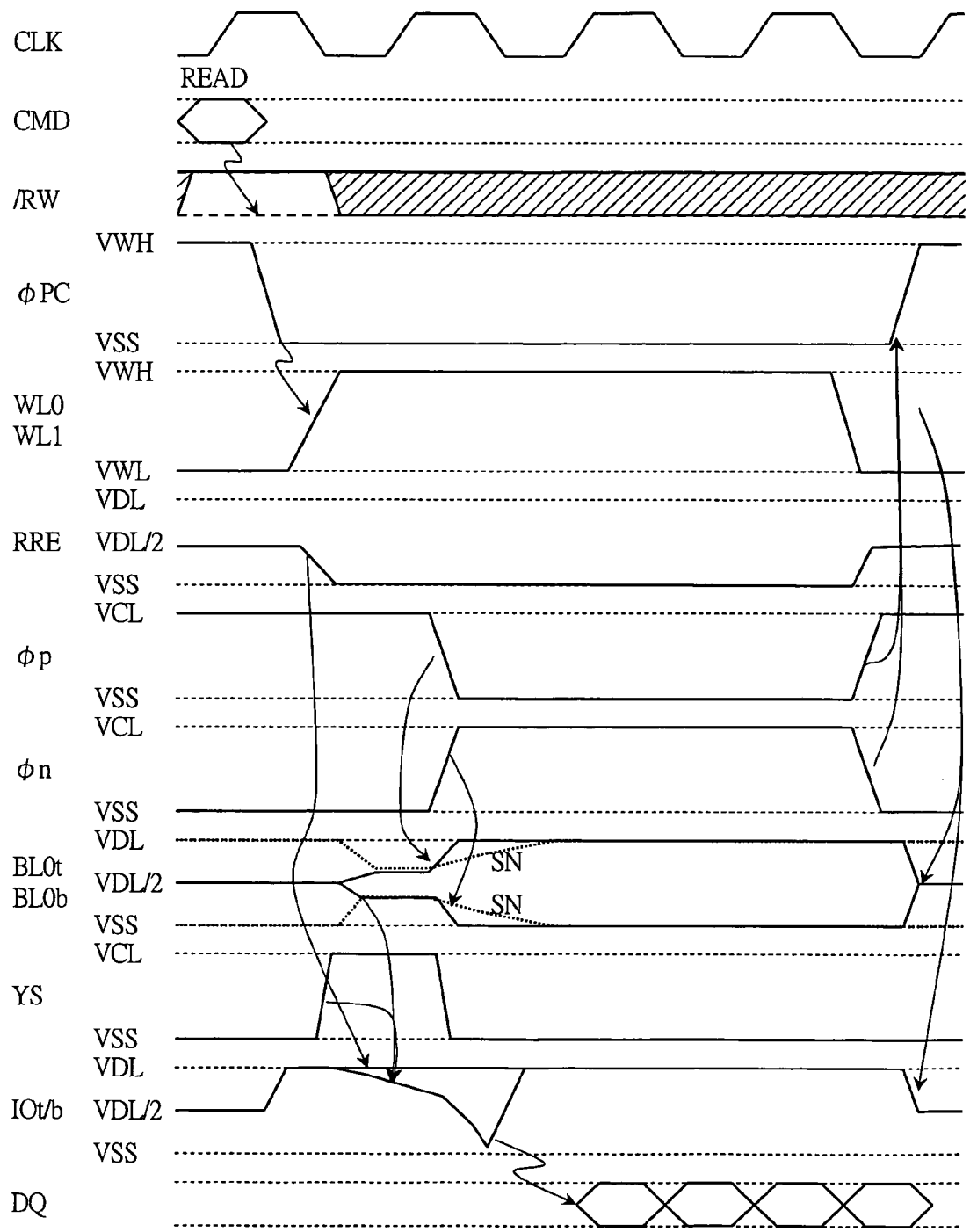
Figure 25:
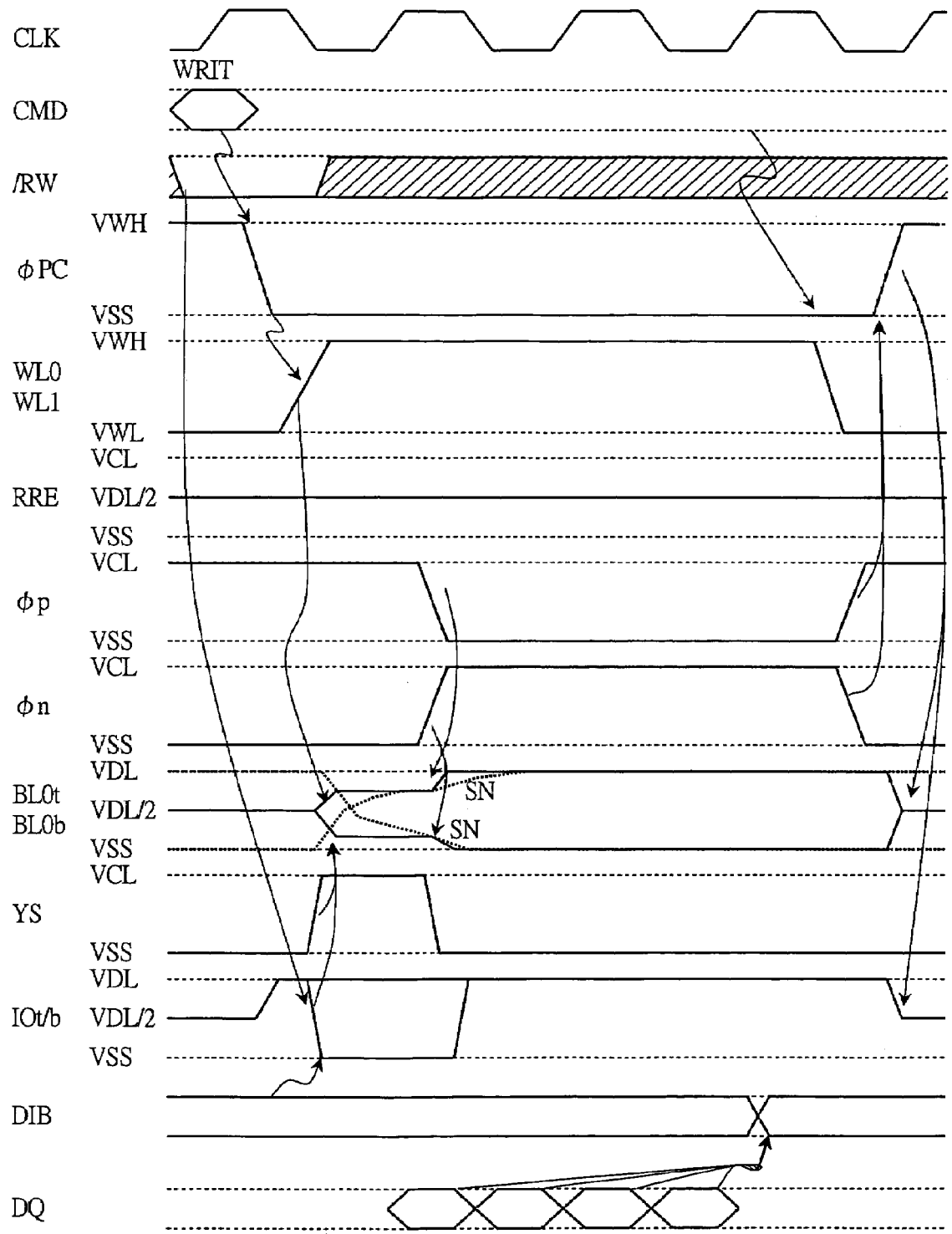
Figure 26:
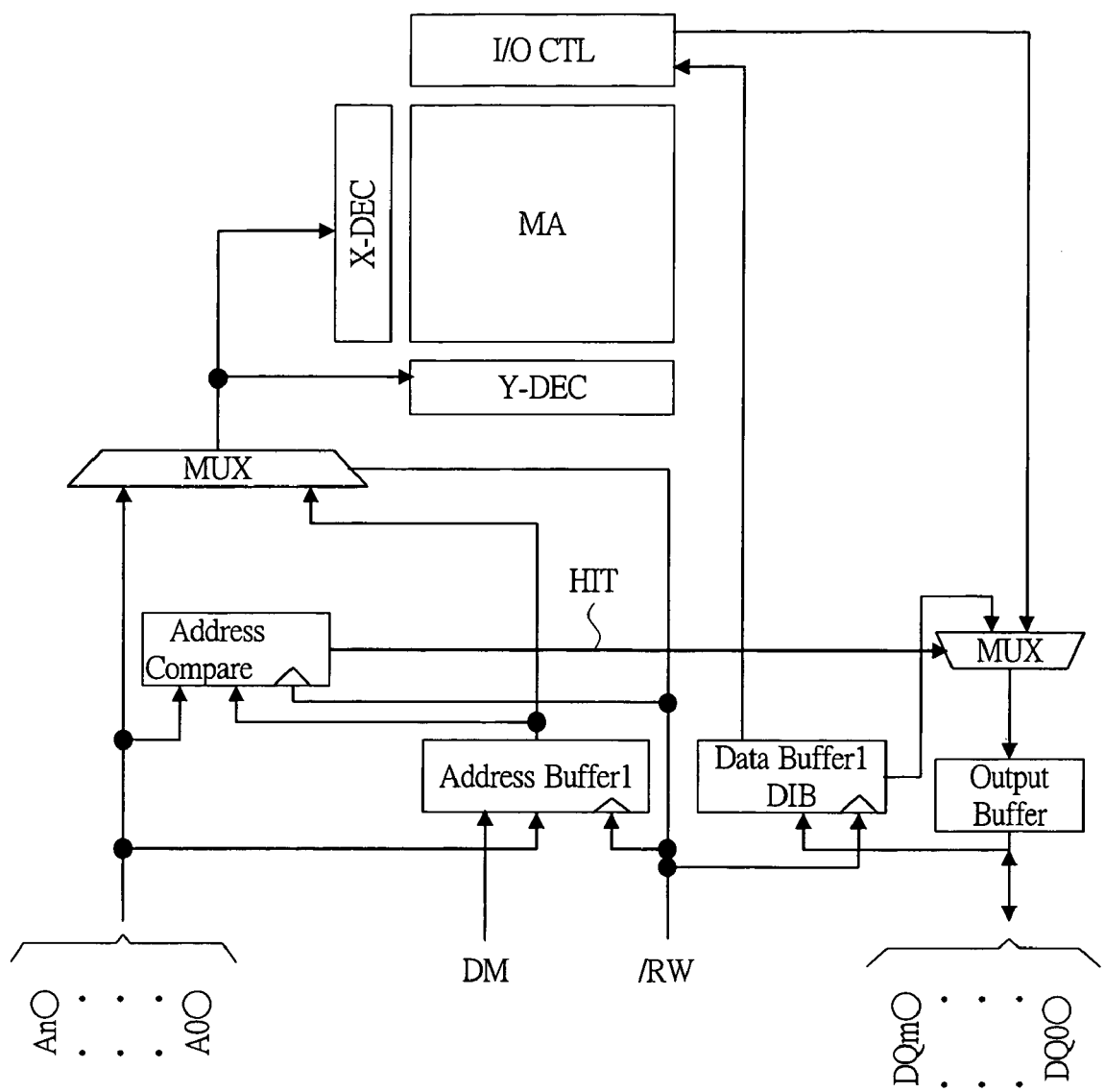
Figure 27:
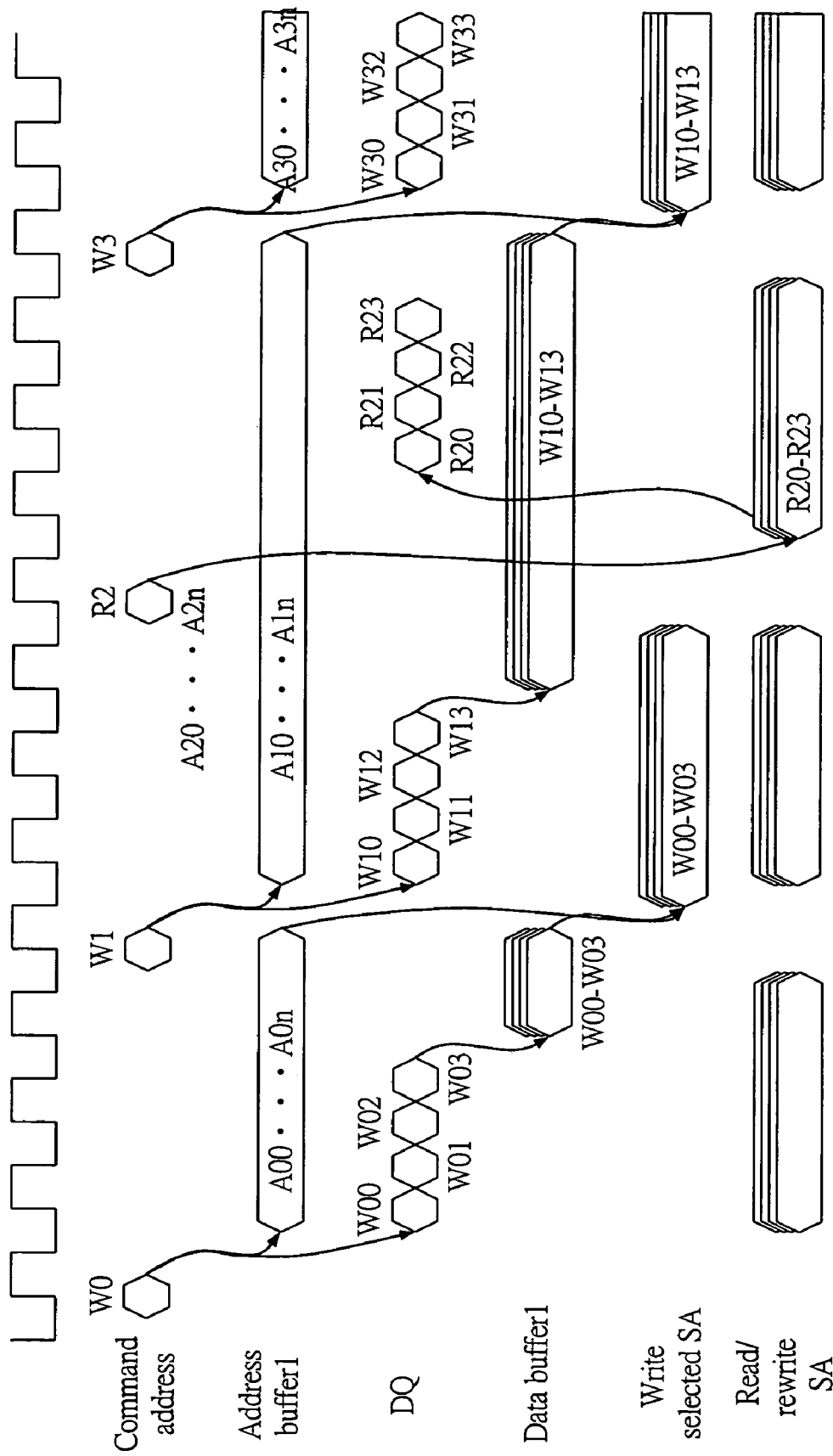
Figure 28:
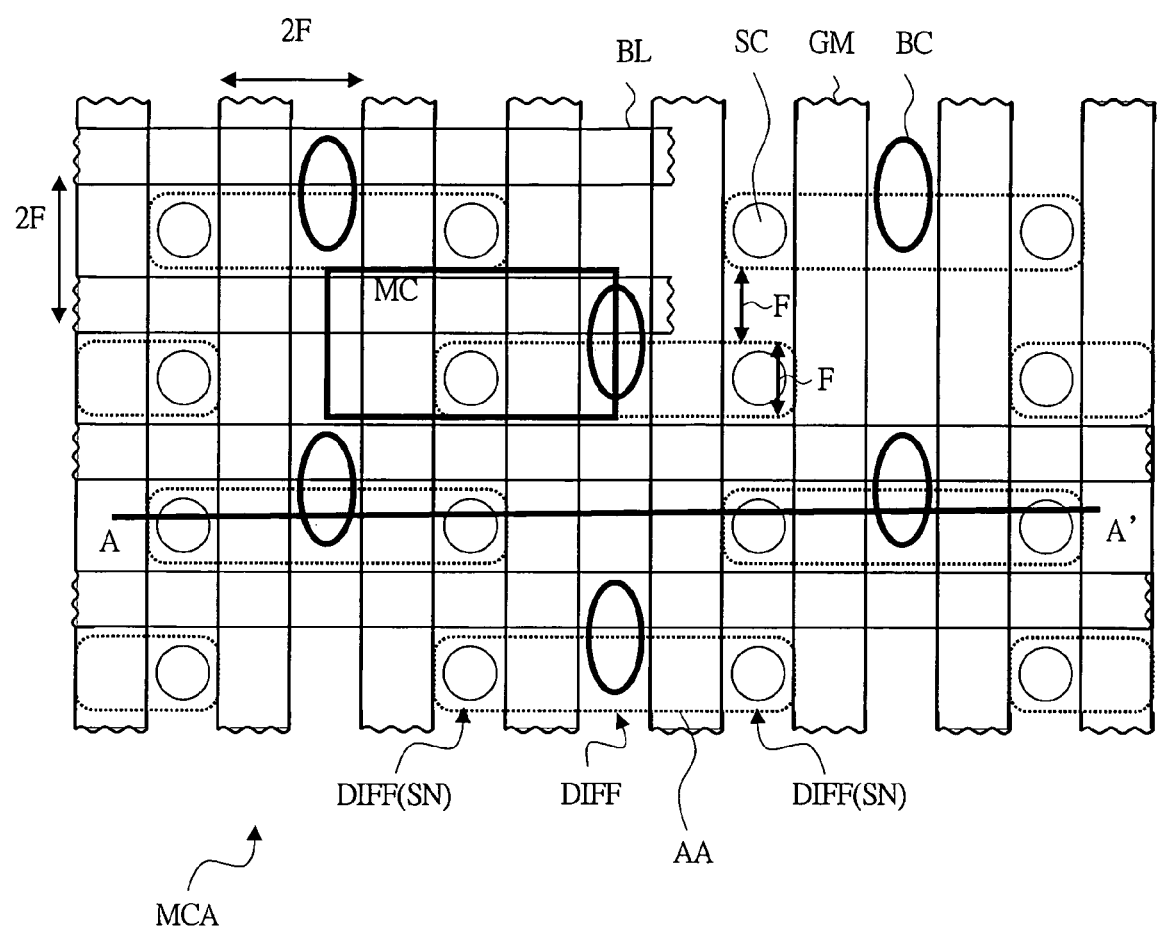
Figure 29:
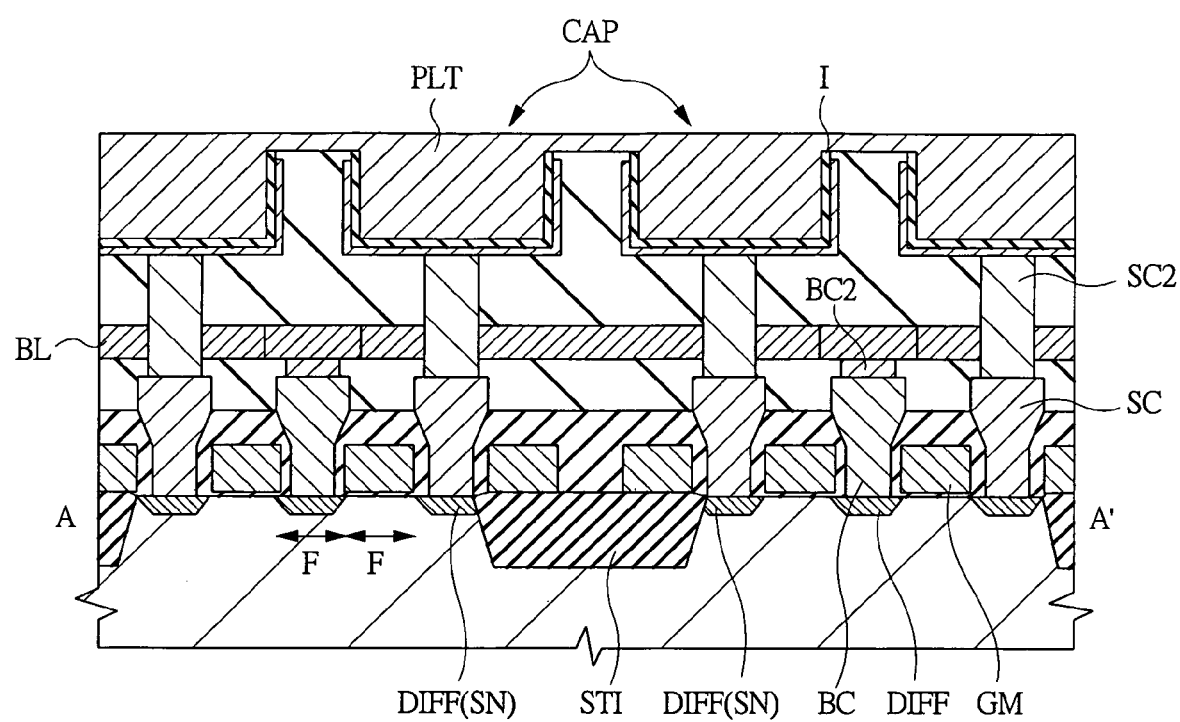
Figure 30:
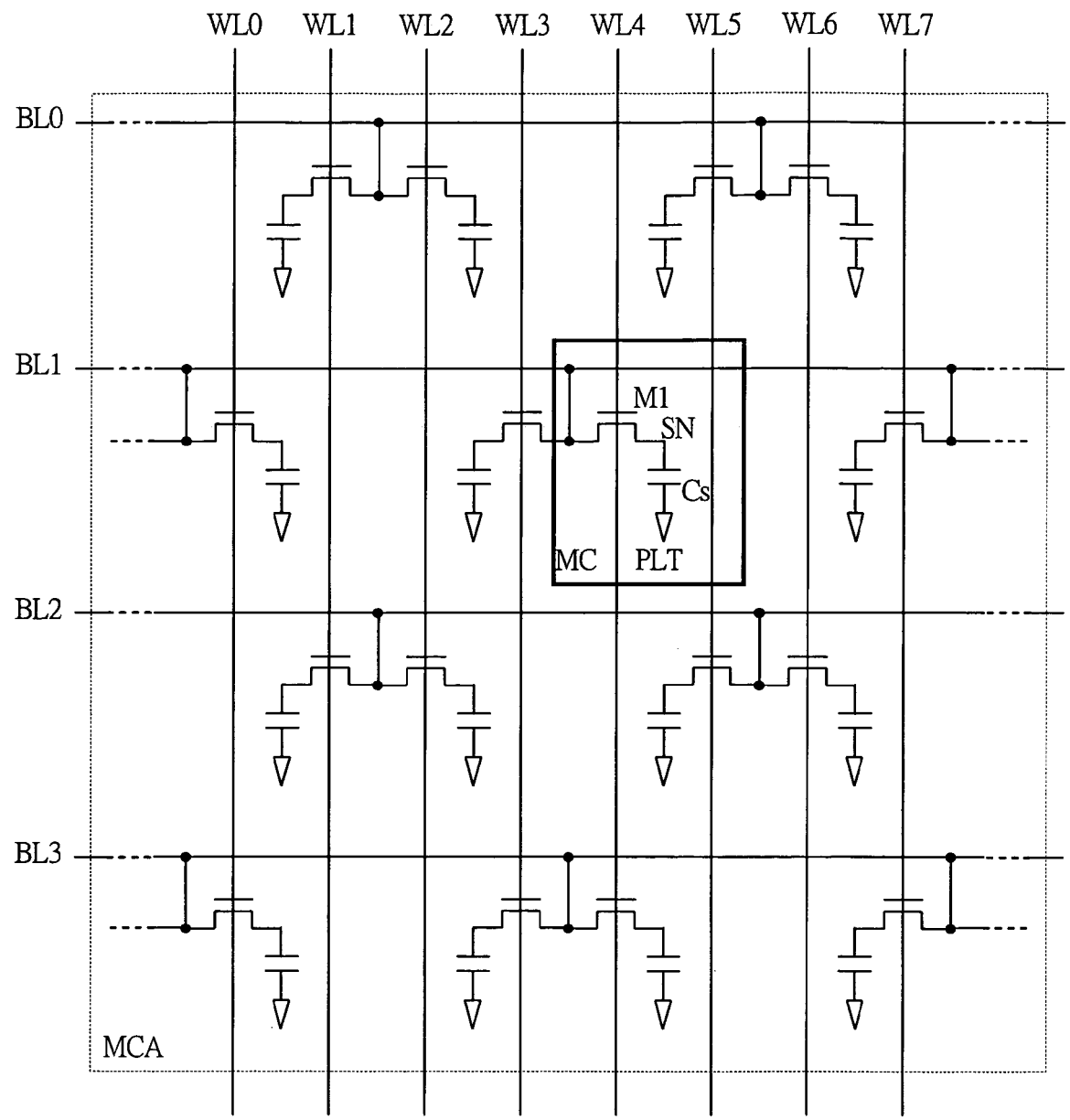

FIG. 5 is a circuit block diagram showing part of block in the whole block configuration with respect to DDR-SDRAM equipped with the memory cell array of embodiments 1 through 3 in the semiconductor memory device according to embodiment 4 of the present invention;

FIG. 6 is a detailed block diagram showing one example of the configuration in the memory array in the circuit block of FIG. 5;

FIG. 7 is a circuit diagram showing one example of the configuration of a sub word driver block in the memory array of FIG. 6;

FIG. 8 is a drawing showing one example of memory cell array and sub word driver block connection configuration in the memory array of FIG. 6;

FIG. 9 is a drawing showing another example of memory cell array and sub word driver block connection configuration in the memory array of FIG. 6;

FIG. 10 is a drawing showing still another example of memory cell array and sub word driver block connection configuration in the memory array of FIG. 6;

FIG. 11 is a drawing showing a further example of memory cell array and sub word driver block connection configuration in the memory array of FIG. 6;

FIG. 12 is a drawing showing an even further example of memory cell array and sub word driver block connection configuration in the memory array of FIG. 6;

FIG. 13 is a circuit diagram showing one example of sense amplifier block configuration in the memory array of FIG. 6;

FIG. 14 is a waveform drawing showing one example of the reading operation in DDR-SDRAM of FIG. 5;

FIG. 15 is a waveform drawing showing one example of the writing operation in DDR-SDRAM of FIG. 5;

FIG. 16 is a sectional view of the substantial part showing one example of sectional structure taken on line A-A' of FIG. 1;

FIGS. 17A and 17B are sectional views of the substantial part showing one example of sectional structure of FIG. 1, in which FIG. 17A shows a cross-sectional structure taken on line B-B' and FIG. 17B shows a cross-sectional structure taken on line C-C';

FIG. 18 is a sectional view of the substantial part showing one example of sectional structure taken on line A-A' of FIG. 4;

FIGS. 19A and 19B are sectional views of the substantial part showing one example of sectional structure of FIG. 4, in which FIG. 19A shows a cross-sectional structure taken on line B-B' and FIG. 19B shows a cross-sectional structure taken on line C-C';

FIG. 20 is a circuit diagram showing one example of configuration of the memory cell array and sense amplifier block with respect to DDR-SDRAM of a twin cell array system equipped with the memory cell array of embodiments 1 through 3 in the semiconductor memory device according to embodiment 5 of the present invention;

FIG. 21 is a waveform diagram showing one example of the reading operation in DDR-SDRAM equipped with the configuration of FIG. 20;

FIG. 22 is a waveform diagram showing one example of the writing operation in DDR-SDRAM equipped with the configuration of FIG. 20;

FIG. 23 is a circuit diagram showing one example of configuration of the memory cell array and sense amplifier block with respect to the memory equipped with an address batch input system and a twin cell array system comprising the memory cell array according to embodiments 1 through 3 in the semiconductor memory device according to embodiment 6 of the present invention;

FIG. 24 is a waveform diagram showing one example of the reading operation in memory equipped with the configuration of FIG. 23;

FIG. 25 is a waveform diagram showing one example of the writing operation in memory equipped with the configuration of FIG. 23;

FIG. 26 is a circuit block diagram showing part of block in the whole block configuration with respect to memory equipped with the address batch input system and twin cell array system comprising the memory cell array according to embodiments 1 through 3 in the semiconductor memory device according to embodiment 6 of the present invention;

FIG. 27 is a timing chart showing one example of the external operation in memory shown in FIG. 26;

FIG. 28 is a drawing showing one example of memory cell layout configuration in a semiconductor memory device according to a conventional technology studied as the premise of the present invention;

FIG. 29 is a drawing showing one example of the cross-sectional configuration taken on line A-A' of FIG. 28; and FIG. 30 is a drawing showing the equivalent circuit of FIG. 28.

DESCRIPTION OF THE PREFERRED EMBODIMENTS

Referring now to the drawings, embodiments according to the present invention will be described in detail hereinafter. By the way, throughout the drawings to explain the embodiments, like reference characters designate like or corresponding members and the repetitive explanation will be omitted. In addition, the circuit symbol of MOSFET (Metal Oxide Semiconductor Field Effect Transistor) with no arrow mark attached is distinguished as an N-type MOSFET (NMOS transistor), while that with an arrow mark attached is distinguished as a P-type MOSFET (PMOS transistor). Hereinafter MOSFET is called a MOS transistor.

Embodiment 1

Figure 2:
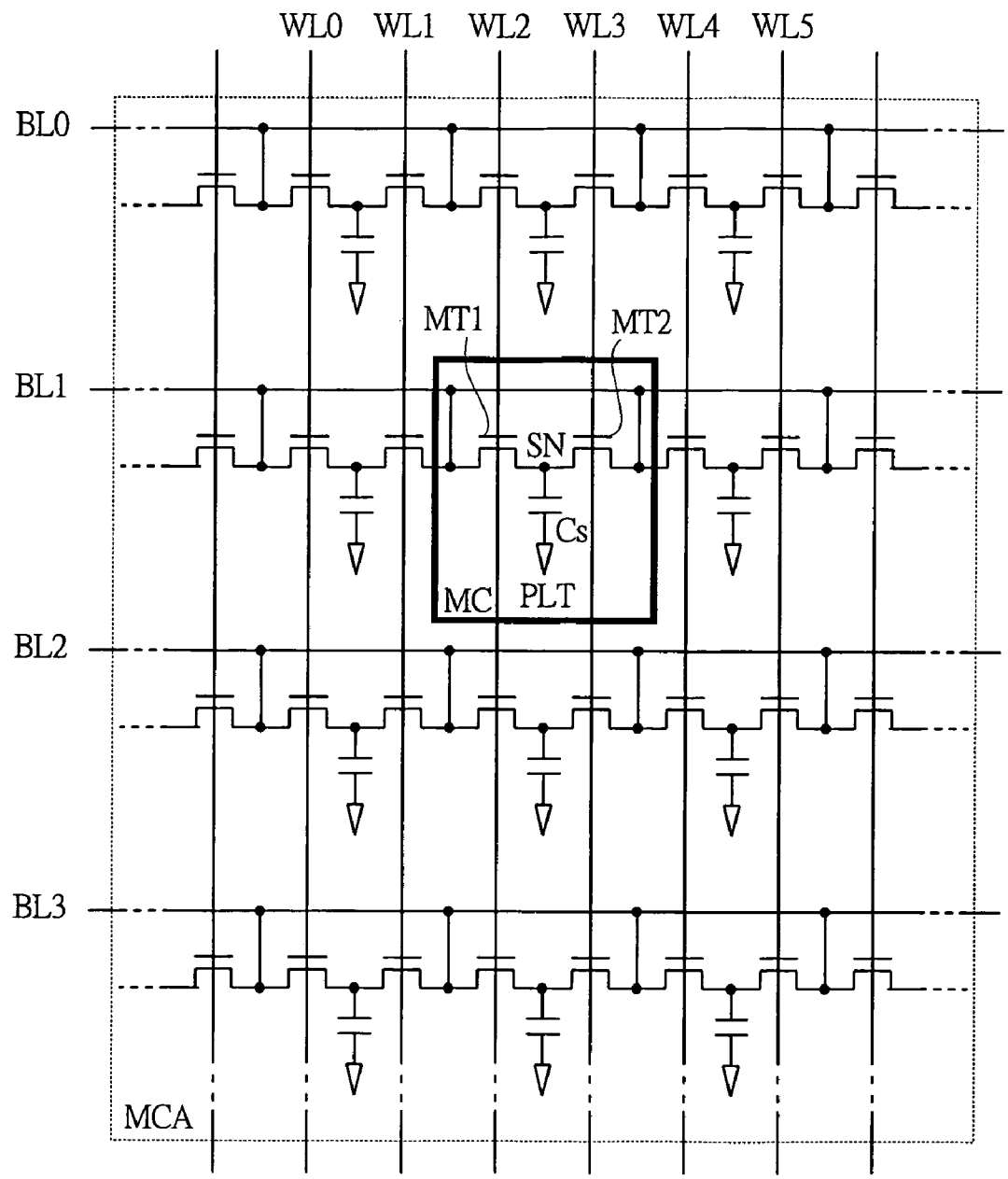
FIG. 2 is an equivalent circuit diagram that corresponds to the memory cell layout of FIG. 1.

FIG. 1 is a layout drawing showing one example of the memory cell layout in a semiconductor memory device according to embodiment 1 of the present invention. FIG. 2 is an equivalent circuit diagram that corresponds to the memory cell layout of FIG. 1.

As illustrated in FIG. 2, the semiconductor memory device according to embodiment 1 of the present invention has a memory cell MC at a desired intersection between a word line WL and a bit line BL in a memory cell array MCA, and one memory cell MC comprises two memory cell transistors MT1, MT2 and one capacitor Cs to store information as electric charges. In the memory cell MC, to a storage node SN (first node), one ends of source terminal/drain terminal of two memory cell transistors MT1, MT2 and one end of capacitor Cs are connected in common, and to bit line BL1, the other ends (second node) of memory cell transistors MT1, MT2 are independently connected, respectively.

Let the wiring pitch of word line WL be 2F (F: feature size) in the layout shown in FIG. 1; then, the bit line BL is wired at a pitch of about 2F. Because in such event, the width of diffusion layer region DIFF which is the gate width of memory cell transistor becomes F and to one memory cell capacitor, two memory cell transistors are connected, the width of the total gate of memory cell transistor becomes 2F.

In addition, in such event, as clear from FIG. 1, the area of memory cell MC becomes $8F^2$ ($2F \times 4F$). Furthermore, it is possible to increase the gate width of memory cell transistor by increasing the width of diffusion layer region DIFF, and the relationship between the memory cell area S and the gate width W in such event is expressed by $S=4F(W/2+F)$. The area increment when the total gate width of memory cell transistor is increased by F is $2F^2$.

Now, the detail of the layout drawing will be explained. In the layout of FIG. 1, one storage node contact SC (second contact) is disposed and on both sides of diffusion layer region DIFF (SN) (second diffusion layer region) which serves as the storage node SN, transistors MT1 and MT2 are disposed. The two transistors MT1, MT2 use the diffusion layer region DIFF (SN) in common as drain or source. The gates GM of transistors MT1, MT2 disposed on both sides of this diffusion layer region DIFF (SN) are used as a word line WL, respectively, and are disposed in parallel to each other. The two word lines connected to the same memory cell comprises a memory cell MC at the intersection of optional bit lines in the memory cell array MCA.

Between word lines WL which forms a pair, a row of storage node contacts SC (second contact row) only is disposed in the direction which the word line WL extends. The storage node contact SC is a contact to connect the electrode on one side of the capacitor CAP for information storage to the diffusion layer region DIFF (SN) of memory cell transistor.

On the other hand, between two word lines connected to the adjacent memory cell (between a word line WL pair and a word line WL pair connected to the adjacent memory cell), a row (first contact row) of bit line contact BC (first contact) only is disposed in the direction in which the word line WL extends. In other words, the storage node contact SC is disposed, and the bit line contacts BC are disposed, respectively in the diffusion layer region DIFF (first diffusion layer region) on the opposite side of the gate GM disposed on both sides as against the diffusion layer region DIFF (SN) which is to be the storage node SN.

The respective bit line contacts BC further share the source or the drain with memory cell transistors of adjacent memory cells, respectively. And respective bit line contacts BC are connected to the common bit line BL wired in parallel to the diffusion layer row (active region AA) to which the storage node contact SC and the bit line contact BC are disposed. In this kind of layout, to the diffusion layer row disposed in parallel with the bit line BL, storage node contacts SC and bit line contacts BC are alternately disposed. In addition, in the present embodiment 1, storage node contacts SC of the memory cell connected to the common bit line BL are all disposed on the same side with respect to the bit line BL.

The gates GM which serve as word lines WL are wired in straight lines and in parallel to each other. On the other hand, the bit line BL is wired to achieve, for example, triangular wave shaped waveform of 4F cycle. Same as the bit line BL, the diffusion layer row (active region AA) disposed in parallel to the bit line BL is disposed to have the waveform of 4F cycle and at the phase with a half cycle shifted from the bit line BL. That is, the bit line BL and the diffusion layer row have shapes axisymmetrical about the direction in which the bit line BL extends.

And bit line contacts BC are disposed in the portion where the bit line BL and the diffusion layer row are overlapped in the vertical direction, and storage node contacts SC are disposed in the portion where the bit line BL does not overlap the diffusion layer row in the vertical direction and is shifted only by F. Consequently, the centerline of the bit line contact BC on the same bit line BL and the centerline of the storage node contact SC of memory cell MC connected to the bit line BL are separated only by about F/2. Because one storage node contact SC and one bit line contact BC are included per one memory cell MC, the number of storage node contact SC and that of the bit line contact BC on the memory array MCA become equal.

In the memory cell layout of the conventional technology as described in FIG. 28, three sides other than the side that composes a memory cell transistor of the four sides that serve as the boundary of the storage node SN, served as the boundary of the isolation region STI. However, because in the memory cell layout of FIG. 1, both sides of all the diffusion layer regions DIFF are used for transistors, the two sides in each diffusion layer region DIFF become the boundary with the isolation region STI, and the length of the boundary with the isolation region STI becomes about ⅔ as compared to the conventional layout.

The description is made on one example of the cross-sectional construction of the DRAM memory array with the present layout applied.

FIG. 16 is a sectional view of the substantial part showing one example of sectional structure taken on line A-A' of FIG. 1. FIG. 16 is an example when the capacitor CAP that stores information is disposed on the upper layer than the bit line BL. By the way, the present layout can be applied to the cross-sectional structure in which the capacitor CAP is disposed below the wiring layer of bit line BL.

In FIG. 16, the memory cell array MCA is disposed in the P-type semiconductor region PWEL. This P-type semiconductor region PWEL is disposed above the N-type semiconductor region DWEL disposed on the lower layer as shown in FIG. 16. The P-type semiconductor region PWEL and N-type semiconductor region DWEL are formed on the P-type substrate p-Sub by the use of technologies such as impurity diffusion, etc. in the regular CMOS process. In addition to the configuration shown in FIG. 16, a configuration in which the P-type semiconductor region PWEL is directly formed on the P-type substrate p-Sub may be adopted.

In the memory cell array MCA, on the P-type semiconductor region PWEL, channels and diffusion layers DIFF of memory cell transistors are alternately disposed in the width of about F, respectively. As shown in FIG. 1, both sides of all the diffusion layer regions DIFF are used as transistors, no isolation region STI is included in the memory cell array MCA in FIG. 16. Consequently, because no boundary exists between the isolation region STI and the diffusion layer region DIFF, defects, etc. caused by difference of stress between the two are difficult to occur, providing an advantage of preventing the defective memory cell MC.

To the P-type semiconductor region PWEL, the desired substrate potential VBB is supplied in the sense amplifier block SAB or sub-word driver block SWDB disposed adjacent to the memory cell array MCA. In FIG. 16, part of the cross-sectional view of adjacent sense amplifier block SAB is shown, and in such event, in the sense amplifier block SAB, for example, to the P-type semiconductor region PWEL, the P-type diffusion region PDIFF is disposed to supply the substrate potential VBB. For the substrate potential VBB, the negative power supply is used when the memory cell transistor is an NMOS transistor so that the threshold voltage of the memory cell transistor can be set the desired voltage.

The P-type semiconductor region of the sense amplifier block SAB and the P-type semiconductor region of memory cell array MCA may be electrically connected or electrically separated. Because connecting them in common no longer requires the area of the isolation region, the present configuration achieves an advantage of reducing the area. On the other hand, in the event that potentials of the P-type semiconductor region of the memory cell array MCA and the P-type semiconductor region of sense amplifier block SAB are separated, the configuration has an advantage of separately setting the substrate potential VBB of NMOS transistor of sense amplifier block SAB from the memory cell array MCA, threshold voltage can be prevented from rising, and high-speed operation can be achieved.

In addition, though not illustrated in FIG. 16, the gate GM of memory cell transistor is built, for example, with poly-silicon with N-type impurities added and then lined with tungsten (W). Lining with tungsten (W) achieves decreased resistance. In addition, the gate GN of NMOS transistors in the sense amplifier block SAB and sub-word driver block SWDB have the same configuration.

On the other hand, PMOS transistor gate GP in sense amplifier block SAB and sub-word driver block SWDB may have a configuration similar to that of the memory cell transistor gate GM and NMOS transistor gate GN or the configuration with poly-silicon with P-type impurities added and then, lined with tungsten (W) to reduce resistance. Because configuring the PMOS transistor gate GP by poly-silicon with N-type impurities added provides an advantage of simplifying the working process. On the other hand, since configuring the PMOS transistor gate GP by poly-silicon with P-type impurities added allows the surface channel configuration to have the PMOS transistor channel configuration, this provides an advantage to improve the transistor current drivability and short channel characteristics. Furthermore, in such event, making the memory cell transistor gate GM same as that of PMOS transistor increases the difference of the work function between the gate GM and the substrate, providing an advantage to be able to set voltage to a large threshold voltage without adding impurities to the substrate.

For two diffusion layer regions DIFF that serve as the source and the drain of a memory cell transistor, on one diffusion layer region DIFF, a bit line contact BC is provided and on the other diffusion layer region DIFF (SN), a storage node contact SC is provided. It is desirable to form this bit line contact BC as well as the storage node contact SC in a self-alignment manner with respect to the gate GM. By this, the distance between the gate GM and the contact center can be shortened and the memory cell area and the chip area can be reduced.

Furthermore, because the bit line contact BC and storage node contact SC form contacts in a self-alignment manner with respect to the diffusion layer region DIFF, too, the memory cell area can be reduced. In addition, the bit line contact BC and the storage node contact SC may be formed simultaneously by the same process. By this, the process operation can be simplified, and furthermore, since in all the diffusion layer regions DIFF, there is either bit line contact BC or storage node contact SC, the configuration provides an advantage that a master pattern of diffusion layer region DIFF can be used when the bit line contact BC and storage node contact SC are formed.

On the bit line contact BC, the second bit line contact BC2 is disposed. On the second bit line contact BC2, the bit line BL is wired. It is desirable from the viewpoint of high-speed operation to configure the bit line BL with low-resistance metal such as tungsten (W), etc. Furthermore, the wiring layer used for the bit line BL on the memory cell array MCA is used as the bit line BL in the sense amplifier block SAB. In the sense amplifier block SAB, the contact CNT formed by the regular CMOS process is used for connecting the diffusion layer region to the bit line BL.

On the storage node contact SC, the second storage node contact SC2 is disposed. Because the second storage node contact SC2 is disposed between the two bit lines BL as clear from the layout shown in FIG. 1, it is desirable to form the second storage node contact SC2 in a self-alignment manner with respect to the bit line BL. Or it is desirable to form the bit line BL wiring width to be thinner than the feature size.

On the second storage contact SC2, a capacitor CAP is formed to store information. The capacitor CAP is able to increase the surface area and increase the capacity by making it three-dimensional. FIG. 16 indicates, for example, a recessed type capacitor. The capacitor CAP has the insulation layer I made from, for example, tantalum pentoxide (Ta2O5), silicon nitride (SiN), or alumina (AlO), hafnium oxide (HfO), and other high dielectric constant material, and the electrode to which the storage node contact SC is connected with the insulation layer I placed in-between made from, for example, titanium nitride (TiN) ruthenium (Ru) and other metals as well as poly-silicon Poly-Si, etc. used.

The electrode on the side opposite to the electrode to which the storage node contact SC is connected is a common plate PLT on the memory cell array MCA. The plate PLT is desirable to be configured with low resistance material such as metal material. By doing so, it is possible to reduce noise to the bit line BL or word line WL, which arises from variations of the plate power supply generated when the memory cell array MCA is operated.

FIG. 17 is a sectional view of the substantial part showing one example of sectional structure of FIG. 1 and FIG. 17A shows a cross-sectional structure taken on line B-B' and FIG. 17B shows a cross-sectional structure taken on line C-C'. On the cross section taken on line B-B', a cross-section that passes storage node contacts Sc, SC2 is shown. As shown in FIG. 17A, the diffusion layer region DIFF and the isolation region STI are disposed at a pitch of the feature size F, respectively. The storage node contact SC is disposed on the diffusion layer region DIFF (SN) of F in width. Similarly, as shown in FIG. 17B, the diffusion layer region DIFF and isolation region STI are disposed at the pitch of feature size F, respectively. The bit line contact BC is disposed on the diffusion layer region DIFF of F in width.

As described above, by the use of the semiconductor memory device of embodiment 1, for example, the following effects can be obtained.

By using the layout shown in FIG. 1, the transistor gate width can be made double that of the feature size F in the memory cell MC of area $8F^2$ with respect to the feature size F and the current drivability can be increased. By this, the write time and read time can be shortened and high-speed operation can be achieved.

In addition, when the gate width W of the memory cell transistor is increased, the memory cell area increases by $4F^2$ in the conventional layout but in the present layout, the area increases only by $2F^2$, and therefore, the memory cell area can be reduced when the gate width is increased, and increased integration and securing current drivability can stand together.

Furthermore, at the boundary between the diffusion layer region DIFF and the isolation region STI, there is a high possibility to give rise to defects, which bring about leak current. As is the case of the present layout, by decreasing the length of the boundary between the diffusion-layer region DIFF and isolation region STI, leak current at this boundary can be reduced and retention time can be improved. In addition, by this, low power consumption can be achieved.

Furthermore, disposing the active region AA in the wave form from the island-form arrangement by the conventional technology can achieve an advantage of facilitating fine processing. In addition, since there are two memory cell transistors for one capacitor, even when one transistor is in the malfunction state, read and write operations are enabled and the percent defective of cells can be reduced.

Embodiment 2

Figure 3:
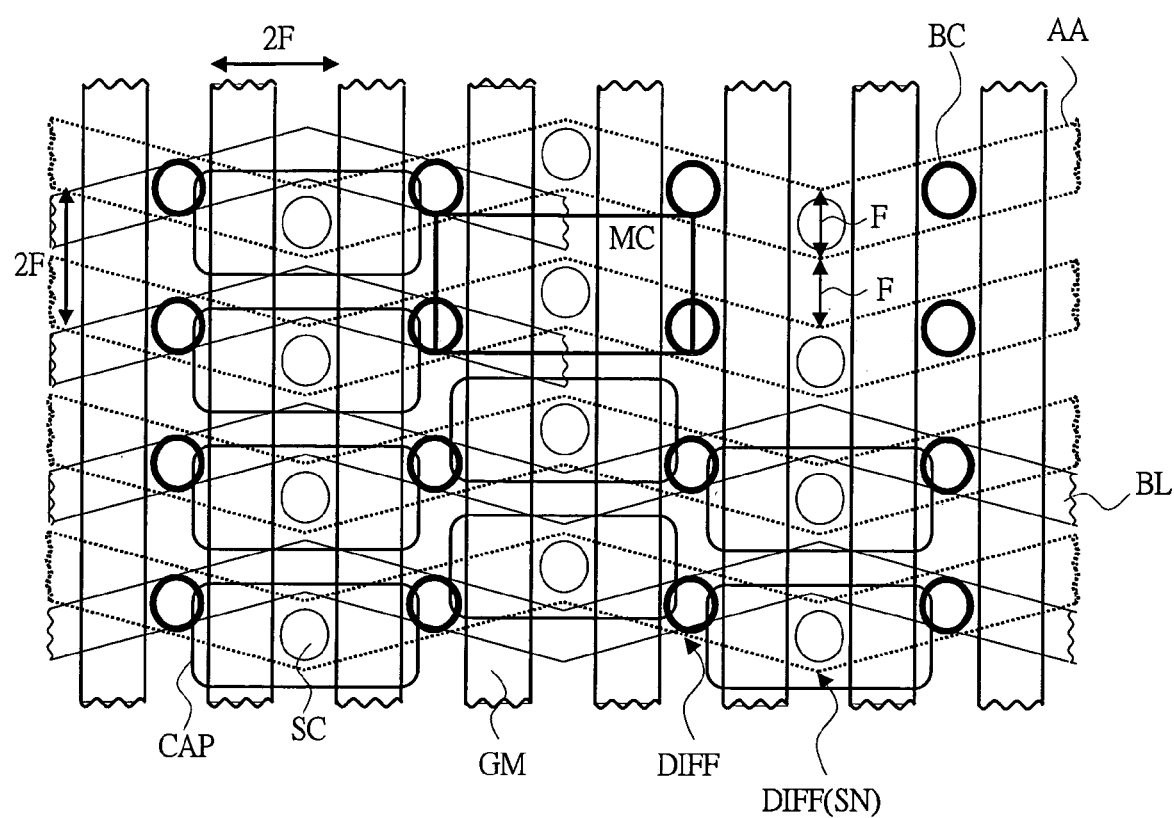
FIG. 3 is a layout drawing showing one example of the memory cell layout in a semiconductor memory device according to embodiment 2 of the present invention.

FIG. 3 is a layout drawing showing one example of the memory cell layout in a semiconductor memory device according to embodiment 2 of the present invention. The memory cell layout shown in FIG. 3 differs from FIG. 1 described above and is characterized in that the bit line and wiring patterns of the diffusion layer row are wired to achieve waveforms of 8F cycle.

The bit line contact BC is disposed at the portion where the bit line BL and the diffusion layer row (active region AA) intersect, and the storage node contact SC is disposed at the position where the bit line BL and the diffusion layer row do not overlap in the perpendicular line but is disposed at the position shifted just by F. The storage node contact SC of the memory cell MC connected to the bit line BL is disposed alternately top and bottom with respect to the bit line BL. Because this arrangement can make the wave-form cycle of the bit line BL and diffusion layer row become 8F as described above as well as extends the center distance of the capacitors disposed on the storage node contact SC. That achieves an advantage of facilitating the formation of capacitors or of increasing the capacitor capacity.

Other configurations are same as that of FIG. 1 described above. The equivalent circuit of the present embodiment 2 is expressed by FIG. 2 as is the case of FIG. 1. For the cross-sectional structure, the configuration in which capacitors CAP are disposed on the it line BL wiring layer as shown in FIG. 16 and FIG. 17 as is the case of FIG. 1 described above is suitable. In addition, this can be applied to the configuration in which capacitor CAP is disposed below the bit line BL wiring layer.

Because the width of the diffusion layer region DIFF which is the gate width of memory cell transistor becomes F, the total gate width of the memory cell transistor connected between one memory cell capacitor and the bit line BL becomes 2F. The area of the memory cell MC in such event becomes $8F^2$ per 1 bit. Furthermore, it is possible to increase the gate width, and the relationship between the memory cell S and the gate width W in such event can be expressed by S=4F (W/2+F), and as compared to the conventional layout, the gate width per area can be increased.

As described above, by using the semiconductor memory device according to embodiment 2, for example, the following effects can be obtained.

Same as the case of embodiment 1 described above, as compared to the conventional type layout, the transistor gate width per unit area can be increased and the current drivability can be improved. In addition, high current drivability and increased integration can stand together. Furthermore, because the boundary length between diffusion layer region and the isolation region can be made short, leak current can be reduced and retention time can be improved. Furthermore, even in the event one of the two transistors of the memory cell is in the malfunction state, read and write operations are enabled, achieving an advantage that the cell percentage defective can be reduced.

Because the center distance of capacitor increases as compared to embodiment 1, the capacitor formation becomes easy and at the same time, the capacity can be increased. Furthermore, the cycle of wave form wiring of the bit line and the diffusion layer row is able to be increased from 4F of FIG. 1 to 8F, and the embodiment is suited for miniaturization processing.

Embodiment 3

FIG. 4 is a layout drawing showing one example of the memory cell layout in a semiconductor memory device according to embodiment 3 of the present invention. The memory cell layout shown in FIG. 4 differs from cases of embodiments 1, 2 and bit lines and diffusion layer row are disposed perfectly parallel in the vertical direction, and is a suitable layout in which the capacitor is formed below the bit line wiring layer.

According to this kind of layout, since the bit lines and diffusion layer row are disposed completely in parallel in the vertical direction, processing and formation of bit lines and diffusion layer row become easy. In addition, because same as the cases of embodiments 1, 2 described above, the width of the diffusion layer region which is the gate width of memory cell transistor becomes F, the total gate width of the memory cell transistors connected between one memory cell capacitor and the bit line becomes 2F. The area of memory cell MC in this event is $8F^2$ per 1 bit. Furthermore, it is possible to increase the gate width, and the relationship between the memory cell area S and the gate width W in such event can be expressed by S=4F (W/2+F)k and as compared to the conventional layout, the gate width per area can be increased.

Now, description will be made on one example of the cross-sectional structure of DRAM memory array with the present layout applied.

FIG. 18 is a sectional view of the substantial part showing one example of sectional structure taken on line A-A' of FIG. 4. The present cross-sectional structure is characterized in that the capacitor CAP that stores information is disposed on the layer below the bit line BL. By the way, this cross-sectional structure can be applied to the layout of FIG. 1 or FIG. 3 as described above, but the case in which it is applied to the layout of FIG. 4 is best-suited.

In FIG. 18, the configurations of substrate, P-type and N-type semiconductor regions and configurations of gates GM, GN, and GP are same as FIG. 16 described above. Furthermore, as is the case of FIG. 16, the bit line contact BC and storage node contact SC disposed at the source or drain of the memory cell transistor are desirably formed in a self-aligned manner with respect to the gate GM. Doing so can reduce the distance between the gate GM and the contact and can reduce the memory cell area.

On the bit line contact BC, the second bit line contact BC2 is disposed. The second bit line contact BC2 is formed to connect the bit line BL to the bit line contact BC disposed on the upper layer of capacitor CAP. Because the second bit line contact BC2 passes between adjacent capacitors, the complete size is desirably formed in a diameter smaller than the feature size. Doing so can not only prevent short-circuiting of the capacitor electrodes but also can increase the capacitor occupied area, achieving an advantage of increasing the capacitor capacity.

In FIG. 18, a figure in which the bit line contact BC and the second bit line contact BC2 are formed by separate processes is shown, but the bit line contact BC and the second bit line contact BC2 may be simultaneously formed. In such event, there is an advantage of achieving simplification of processing operation.

In addition, same as FIG. 16, on the second bit line contact BC2, the bit line BL is disposed. The bit line BL is desirable to be formed with low-resistance metal such as tungsten (W) or aluminum (Al) from the viewpoint of high-speed operation. Furthermore, the wiring layer used for the bit line BL on the memory array MCA is used for the bit line in the sense amplifier block SAB, too.

In the sense amplifier block SAB, for connection between the diffusion layer region and the bit line BL, a contact CNT formed in the regular CMOS process is used. In addition, this contact CNT may be formed by the process same as the bit line contact BC and second bit line contact BC2 mentioned above. In such event, there is an advantage that the process operation can be simplified. On the storage node contact SC, the second storage node contact SC2 is disposed. On the second storage contact SC2, capacitor CAP to store information is formed. The configuration of capacitor CAP is same as FIG. 16 described above.

FIGS. 19A and 19B are sectional views of the substantial part showing one example of sectional structure of FIG. 4, and FIG. 19A shows a cross-sectional structure taken on line B-B' and FIG. 19B shows a cross-sectional structure taken on line C-C'. The cross-section taken on line B-B' shows a cross section that passes storage contacts SC, SC2.

As shown in FIG. 19A, the diffusion layer region DIFF and isolation region STI are disposed at the pitch of feature size F, respectively, as is the case of FIG. 17A described above. The storage node contact SC is disposed on the diffusion layer region DIFF (SN) of F in width. Same as this, in FIG. 19B, too, the diffusion layer region DIFF and the isolation region STI are disposed at the pitch of feature size F, respectively. The bit line contact BC is disposed on the diffusion layer region DIFF of F in width.

As described above, by the use of the semiconductor memory device according to embodiment 3, for example, the following effects can be achieved.

Same as embodiments 1 and 2 which have already been described, as compared to the layout of conventional types, the transistor gate width per unit area can be increased and improvement of current drivability can be achieved or improvement of current drivability and increased integration can stand together. In addition, because the boundary length between the diffusion layer region and the isolation region can be shortened, leak current can be reduced and retention time can be improved. Furthermore, even in the event that one of the two transistors of memory cell is in the malfunction state, read and write operations are enabled, and this configuration has an advantage to reduce percentage defective of cells.

And as compared to cases of embodiments 1, 2 described above, the patterns of bit line and diffusion layer region become a straight line, and therefore, it becomes easy to form respective patterns and is suited for miniaturization process.

Embodiment 4

In embodiment 4, referring now to the cases with memory cell array described in embodiments 1 through 3 applied to the synchronous DRAM (SDRAM) used as an example, the configuration, operation, and others of SDRAM will be described. By the way, in this part of the section, description will be made with a double data rate type SDRAM (DDR-SDRAM) taken as an example.

FIG. 5 is a circuit block diagram showing part of block in the whole block configuration with respect to DDR-SDRAM equipped with the memory cell array of embodiments 1 through 3 in the semiconductor memory device according to embodiment 4 of the present invention. Each circuit block operates at a timing of internal control signals formed in the timing generator TCG to which control signals are entered.

Examples of control signals entered in the timing generator TCG include clock signal CLK, chip selection signal /CS entered at a timing of /CLK, low address strobe signal /RAS, column address strobe signal /CAS, and write enable signal /WE. Combinations of these control signals with address signals are called commands. The clock enable signal CKE determines valid/invalid of clock signals. In addition, the I/O mask signal DQM is a signal to control the data I/O buffer I/O B to mask the data entered and outputted from the I/O terminals (DQ0, . . . , DQn).

The power supply generator VG supplies circuits to word line charge pump level (VWH), substrate potential (VBB), array voltage (VDL), peripheral circuit voltage (VCL), word line unselected level (VWL), etc.

In SDRAM, an address multi system in which low addresses and column addresses are entered in a time-sharing manner from address input terminals (A0, A1, . . . , An) is adopted. The low address entered from the address input terminal to the low address buffer XAB is decoded by the low address decoder X-DEC, and a specific word line in one memory array (MA) is chosen. In response to it, the memory cell equal to one word is in the selected state. Then, when the column address is entered in the column address buffer YAB, a memory cell which is read or written by the column address decoder Y-DEC is further chosen. By the way, SDRAM has multiple memory arrays (or memory banks) normally designated by the bank address but in this figure, one memory array MA (BANK0) only is representatively shown.

FIG. 6 is a detailed block diagram showing one example of the configuration in the memory array in the circuit block of FIG. 5. As shown in FIG. 6, one memory array MA (bank BANK0) comprises multiple memory regions surrounded by X-DEC that selects word lines from the line address and Y-DEC that selects data lines from the row address, and the memory region includes multiple sub-memory arrays (memory cell arrays MCA) disposed in a matrix form. This is not particularly limited to this but this memory array MA adopts the hierarchical word line scheme, and on one side of the memory array MA, a main word driver block MWDB that contains multiple main word drivers MWD (not illustrated) is disposed.

The main word line MWL connected to the main word driver block MWDB is provided to the metal wiring layer of the upper layer in such a manner as to stride over multiple sub-memory arrays. In addition, for selection of the column direction, a common Y decoder system is adopted, in which multiple column selection lines (YS lines) outputted from the column address decoder Y-DEC are provided in such a manner as to cross over and stride over multiple sub-memory arrays. The sub-memory array means a minimum memory array block surrounded by a sub word driver block SWDB comprising multiple sub-word drivers SWD and a sense amplifier block (SAB) comprising multiple sense amplifier circuits. And to these sub-memory arrays, memory cell arrays MCA as shown in Embodiments 1 through 3 are applied.

FIG. 7 is a circuit diagram showing one example of the configuration of a sub word driver block in the memory array of FIG. 6. On the sub-word block SWDB, a main word line MWL driven from the main word driver MWD, predecode signal FXB driven from the low address decoder X-DEC, and predecode signal FX driven from the cross area XA by the reversing signal are wired.

The sub-word driver SWD comprises a PMOS transistor in which the predecode signal FX is entered in the source, main word line MWL is entered in the gate, and the drain is connected to the word line WL; an NMOS transistor in which the main word line MWL is connected to the gate, word line WL to the drain, and word line standby voltage VWL to the source; an NMOS transistor in which the predecode signal FXB is connected to the source, word line WL to the drain, and word standby voltage VWL to the source; and others. This subword driver block SWDB has a configuration to activate the word line WL which is chosen by both when one of the multiple main word lines MWL is chosen or one of the multiple predecode signals FX is chosen.

FIG. 8 is a drawing showing one example of memory cell array and sub word driver block connection configuration in the memory array of FIG. 6. In the present configuration, each of two word lines WL that drive one memory cell MC is lading from the respective sub-word driver blocks SWDB-U and SWDB-D (first word driver group and second word driver group) disposed above and below the memory cell array MCA. And inside the memory cell array MCA in which these memory cells MC gather, it is configured that the word line WL is connected to upper and lower sub-word driver blocks SWDB-U and SWDB-D at intervals of two pieces.

Because under the present configuration, the word line WL of the selected memory cell MC is driven from upper and lower sub-word driver blocks SWDB-U and SWDB-D, this configuration has an advantage to reduce the difference between the far end and the near end from the sub-word driver block when memory data is read. In addition, in the memory cell array MCA, pulling word lines WL from the sub-word driver block SWDB-U, SWDB-D at intervals of 2 pieces can achieve an advantage to prevent disconnection and short-circuiting of the word line between the memory cell array and the sub-word driver block when the phase shift lithography is adopted to the lithography process when the gate layer is processed.

FIG. 9 is a drawing showing another example of memory cell array and sub word driver block connection configuration in the memory array of FIG. 6. In the present configuration, same as the configuration of FIG. 8, two word lines WL of one memory cell are driven one each from the sub-word driver block SWDB-U, SWDB-D, respectively, disposed above and below the memory cell array MCA. However, unlike the above-mentioned configuration, the present configuration is characterized in that the word line WL of memory cell array MCA is connected alternately one each to upper and lower sub-word driver blocks SWDB-U and SWDB-D.

FIG. 10 is a drawing showing still another example of memory cell array and sub word driver block connection configuration in the memory array of FIG. 6. In the present configuration, two word lines WL of memory cell MC are driven in common by the use of upper and lower sub-word driver blocks SWDB-U, SWDB-D. Two word lines WL are connected in common at the boundary of memory cell array MCA (between memory cell array MCA and sub-word driver block) and simultaneously driven from both upper and lower sub-word driver blocks SWDB-U, SWDB-D. By this, the difference between the far end and the near end from the sub-word driver block when memory data is read can be reduced.

FIG. 11 is a drawing showing a further another example of connection configuration of memory cell array and sub word driver block in the memory array of FIG. 6. In the present configuration, two word lines WL connected to one memory cell are connected at the boundary of memory cell array MCA, which is formed between either of upper or lower sub-word driver blocks SEDB-U, SWDB-D and memory cell array MCA, and driven from either of upper or lower sub-word driver block. The configuration of FIG. 11 does not reduce the difference between the far end and the near end as compared with the configuration of FIG. 10, but since the number of sub-word drivers can be reduced to half, the area of the sub-word driver blocks SWDB-U, SWDB-D can be reduced to half, and the chip area can be reduced.

FIG. 12 is a drawing showing an even further another example of connection configuration of memory cell array and sub word driver block in the memory array of FIG. 6. This configuration is characterized in that all the word lines WL that intersect the specific bit line BL are driven from the sub-word driver blocks disposed on one side of the memory cell array MCA. By this, all the word lines WL operate at the same timing, so that the configuration has an advantage to be able to easily set the start timing margin between the word line WL and sense amplifier.

FIG. 13 is a circuit diagram showing one example of sense amplifier block configuration in the memory array of FIG. 6. The sense amplifier blocks SAB (first sense amplifier group and second sense amplifier group) are disposed on both sides of the memory array MCA in the memory array MA, respectively, as shown in FIG. 6. And the sense amplifier block SAB shown in FIG. 13 indicates the configuration of so-called open type bit line. That is, to a pair of bit lines BLt/b, one each of which is leading from right and left memory cell arrays MCA respectively, one sense amplifier circuit is connected. And the sense amplifier circuits are disposed to meet the number of bit line pairs BLt/b leading from the memory cell arrays MCA.

The sense amplifier circuit outputs cross-couple type sense amplifier CC which amplifies microsignals between bit line pairs BLt/b to a specified voltage amplitude; precharge circuit PC which sets the bit line pairs BLt/b to the desired bit line precharge level at the time of standby;, and an IO gate IOG to output the data held in the sense amplifier and to write the write data from the outside in the sense amplifier.

The cross-couple type sense amplifier CC comprises a pair of NMOS transistors with their sources used in common and gates connected to their drains and a pair of PMOS transistors with the sources used in common and gates connected to their drains in the similar manner. The sources of NMOS transistors and PMOS transistors are connected to NMOS common source line NCS and PMOS common source line PCS in common by the cross couple type amplifier CC located in the sense amplifier block SAB, respectively.

Common source lines NCS, PCS are connected to power supplies VSS, VDL by sense amplifier activation signals φn, φp, respectively. In addition, common source lines NCS, PCS are set to the bit line precharge level by the common source precharge circuit CSPC disposed in the cross area XA in accordance with the bit line precharge signal φPC during standby.

The precharge circuit PC comprises a switch to supply the bit line precharge level to the bit line pairs BLt/b and a switch to short across bit line pairs BLt/b, which are controlled by the precharge signal φPC. In the figure, all are configured by NMOS transistors. The IO gate IOG connects IO lines IOt/b to bit line pairs BLt/b by a switch controlled by the column selection signal YS. The column selection signal YS is driven from the column address decoder Y-DEC.

The circuit configuration of the sense amplifier block SAB is not limited to those shown herein but other configurations can be acceptable as far as they possess the same functions. For example, an overdrive system as disclosed in publicly known literature (for example, Japanese Patent Application Laid-Open Publication No. 2-246089) may be applied. In such event, the configuration provides an advantage to achieve high-speed operation.

Referring now to FIG. 14, operation of DDR-SDRAM of FIG. 5 is described.

FIG. 14 is a waveform drawing showing one example of the reading operation in DDR-SDRAM of FIG. 5. For the connection method of the memory array MCA to sub word driver block SWDB-U, SWDB-D in FIG. 6, the same operations can be achieved by any method described in FIG. 8 through FIG. 12.

In FIG. 14, when an active command ACT is entered together with a low address, decoding of the address takes place inside. By this, in the sense amplifier block SAB of the corresponding address, the bit line precharge signal φPC is shifted to the nonactivated state. Because the precharge circuit PC is configured with NMOS transistors, the bit line precharge signal φPC is shifted from the high potential level of the activated state (for example, word line charge pump power supply VWH or bit line swing voltage VDL) to the ground level VSS. By this, precharge of bit lines BL0t/b of corresponding memory cell array MCA and common source lines NCS, PCS of sense amplifier block SAB are stopped.

Then, the word line WL that corresponds to the entered address is chosen. In such event, in the chosen word line WL, two word lines connected to one memory cell (for example, corresponds to two word lines WL that intersect WL0, WL1 of FIG. 2, BL0t in FIG. 13, etc.) are simultaneously activated. Or, in order to reduce the peak current of the word line charge pump power supply VWH, the activation timing of word lines WL0, WL1 may be off.

The activated word lines WL0, WL1 shift from the word line standby level VWL to word line selection level VWH. In response to this, in the memory cell MC, gates of two transistors are selected, storage node SN and bit line BLt are connected, and the memory cell MC data is read out to the bit line BLt. FIG. 14 shows the case in which 'H' data is stored in the storage node SN of the memory cell MC connected to BL0t of FIG. 13. The bit line BL0t in such event has the voltage higher from the precharge level for electric charges accumulated in the storage node SN.

After the word line WL is activated and a specified period passes, the NMOS sense amplifier activation signal φn is shifted from the ground level VSS of the unselected state to high potential VCL of the activated state (for example, bit line swing voltage VDL or word line voltage VWH, etc.), and NMOS cross couple is activated. Nearly simultaneously with this or slightly late, PMOS sense amplifier activation signal φp is shifted from high potential VCL of the unselected state (for example, bit line swing voltage VDL or word line voltage VWH, etc.) to ground level VSS of the activated state, and PMOS cross couple is activated. Due to this, microsignal voltage generated in bit lines BL0t/b is amplified to the bit line swing voltage. Under this condition, the device becomes the column command input wait state.

The actual column command is allowed to be entered simultaneously or before the bit line amplitude achieves the sufficient amplitude. In this case, an example in which the read command READ is entered from the outside is shown. The read command READ and a column address desired to be read simultaneously are entered. When the read command is entered, in accordance with the address simultaneously entered, the column selection line YS from the column address decoder Y-DEC shifts from the ground level VSS in the standby state to the high potential VCL in the selected state (for example, bit line swing voltage VDL, etc.) and becomes activated state. By this, the data held in the sense amplifier is read out to I/O lines IOt/b. Thereafter, it is not illustrated in FIG. 14 but the data is outputted to the outside via the main amplifier and I/O section.

Now, the operation when precharge command PRE is entered is discussed. In the event that a precharge command is entered in the command entry wait state, the word line WL chosen is shifted to the word line standby level VWL when the selected word line WL is in the unselected state. In accordance with this, the sense amplifier activation signals φn, φp become the unselected state. After the sense amplifiers become the inactivated state, the bit line precharge signal φPC becomes the activated state, and all the bit lines BL and reference bit lines of activated memory cell arrays MCA are set to VDL/2 which is ½ of the bit line swing voltage. This completes the precharge operation.

Next discussion will be made on the write operation. FIG. 15 is a waveform drawing showing one example of the writing operation in DDR-SDRAM of FIG. 5. In FIG. 15, operations when active command ACT is entered and sense amplifiers are activated until the column command is entered are the same as the reading operation discussed above.

The writing operation is carried out by simultaneously entering the write command WRIT and write address in the column command entry wait state. That is, there are cases in which the write command and write address are entered right after the active command as is the case of FIG. 15 or in which they are entered after the above-mentioned read command READ. The write data is entered simultaneously with commands and addresses or at the edge of rising or trailing after one clock cycle time. The write data is entered from the I/O pin DQ and transferred to internal I/O lines IOt/b. The transferred data is written, by the column selection line YS chosen in accordance with the write destination entered together with the write command, in the sense amplifier circuit to which memory cell MC of the write address is connected.

In the sense amplifier circuit, the bit line pair (for example, BL0t/b) is driven and the data is written in the storage node SN of memory cell MC in accordance with the data written from the I/O lines IOt/b. In FIG. 15, a waveform drawing with 'H' data entered to an "L" cell is shown. The internal operation after the precharge command PRE is entered is same as that explained when the above-mentioned read operation is carried out.

By the way, the present operation discusses part of the DDR-SDRAM operation but the memory cell layout of the present invention can be applied to regular SDRAM or DDR2-SDRAM. Furthermore, the present memory cell layout is particularly useful when it is applied to a semiconductor memory device that adopts a process with the feature size not more than 0.13 μm where it becomes difficult to reduce the film thickness of gate oxide film of memory cell transistors and lowering of current drivability of memory transistor causes a problem.

Embodiment 5

In embodiment 5, the configuration and operation will be discussed with the case of applying the memory cell array discussed in embodiments 1 through 3 used as an example for SDRAM of the twin cell array system in which 1 bit is stored in two memory cells. In this case, same as embodiment 4, discussion will be made with DDR-SDRAM taken for an example.

FIG. 20 is a circuit diagram showing one example of configuration of the memory cell array and sense amplifier block with respect to DDR-SDRAM of a twin cell array system equipped with the memory cell array of embodiments 1 through 3 in the semiconductor memory device according to embodiment 5 of the present invention. As shown in FIG. 20, the configuration of embodiment 5 differs from the configuration of embodiment 4, and as is the case of the memory cell MC which is connected to both of bit lines that make a pair with respect to the same word lines WL (for example, BL0t, BL0b), bit lines are connected between memory cell array MCA and sense amplifier block SAB. That is, from the same memory cell array MCA, two bit lines are leading to each sense amplifier circuit (first sense amplifier circuit) in the sense amplifier block SAB as a pair of bit lines (first bit line pair).

In such event, 'H' data is stored in one of the two memory cells MC and 'L' data is stored in the other memory. Consequently, because the memory data read time is determined by the 'L' data, high-speed reading can be achieved as well as the data pattern dependence of reading time is small. Furthermore, because the read signal amount is increased by about double as compared to the operation with one cell, it is not necessary to take large timing margin. Based on these, the configuration is suited for high-speed operation.

In addition, in the configuration of sense amplifier block SAB, cross-couple type sense amplifier CC, precharge circuit PC, and IO gate IOG are same as those of embodiment 4. However, in the present circuit configuration, one sense amplifier block SAB is shared by memory cell arrays MCA disposed on both sides. Consequently, on the memory cell array MCA side in the sense amplifier block SAB, shared gate SHR is disposed. The shared gate SHR is a circuit block that controls connection/isolation of the bit line in the memory cell array and bit line in the sense amplifier by the gate signals SHRR, SHRL. By sharing the sense amplifier block SAB by adjacent memory cell arrays in this way, the configuration achieves advantages of reducing the number of sense amplifier blocks and reducing the chip area.

Other configurations are same as those of embodiment 4.

Next discussion will be made on the operation of semiconductor memory device according to embodiment 5. FIG. 21 is a waveform diagram showing one example of the reading operation in DDR-SDRAM equipped with the configuration of FIG. 20. The connection method of memory cell array MCA with sub-word driver bocks SWDB-U, SWDB-D ensures the same operations in any cases of FIG. 8 through FIG. 12.

In FIG. 21, when the active command ACT is entered together with the low address, decoding of the address takes place inside. By this, in the sense amplifier block SAB at the corresponding address, bit line precharge signal φPC shifts to the inactivated state. In this case, because the precharge circuit PC is configured by NMOS transistors, the state is changed from the high potential level of the activated state (for example, word line charge pump power supply VWH or bit line swing voltage VDL) to ground level VSS. By this, precharge of the bit lines BLt/b of the corresponding memory cell array MCA and common source lines PCS, NCS of sense amplifier block SAB are stopped.

Almost simultaneously, in order to choose the memory cell array MCA to be connected to the sense amplifier block SAB, either one of shared gates SHRR or SHRL is changed from word line charge pump power supply VWH to ground level VSS. In FIG. 21, shared gate signal SHRL is changed to the ground level VSS.

Then, the word line WL that corresponds to the entered address is chosen. In such event, the chosen word line WL has the two word lines connected to one memory cell (for example, corresponds to WL0, WL1 of FIG. 2, two word lines WL that intersect BL0t/b, etc. in FIG. 20) simultaneously activated. Or in order to reduce the peak current of the word line charge pump power supply VWH, the activation timing of word lines WL0, WL1 may be off.

The activated word lines WL0, WL1 are changed from the word line standby level VWL to word line selection level VWH. In response to this, in the memory cell MC, gates of two memory cell transistors enter the selection state, the storage node SN is connected to the bit lines BLt/b, and the data of memorial MC is read to the bit lines BLt/b. In such event, because to all of the bit line pairs BL0t/b, BL1t/b, . . . , memory cells are connected, and furthermore, the bit line pairs and data stored in the memory cell are complementary to each other, to either one of the bit lines BL0t/b, the 'H' data is read without fail, and to the other, 'L' data is read, and the bit lines BL0t/b are driven vertically with respect to the precharge level VDL/2 before reading.

After the word line WL is activated and a specified period passes, the NMOS sense amplifier activation signal φn is shifted from the ground level VSS of the unselected state to high potential VCL of the activated state (for example, bit line swing voltage VDL or word line voltage VWH, etc.), and NMOS cross couple is activated. Nearly simultaneously with this or slightly late, PMOS sense amplifier activation signal φp is shifted from high potential VCL of the unselected state (for example, bit line swing voltage VDL or word line voltage VWH, etc.) to ground level VSS of the activated state, and PMOS cross couple is activated. Due to this, microsignal voltage generated in bit lines BLt/b is amplified to the bit line swing voltage. Under this condition, the device becomes the column command input wait state.

The actual column command is allowed to be entered simultaneously or before the bit line amplitude achieves the sufficient amplitude. In this case, an example in which the read command READ is entered from the outside is shown. The read command READ and a column address desired to be read simultaneously are entered. When the read command is entered, in accordance with the address simultaneously entered, the column selection line YS from the column address decoder Y-DEC shifts from the ground level VSS in the standby state to the high potential VCL in the selected state (for example, bit line swing voltage VDL, etc.) and becomes activated state. By this, the data held in the sense amplifier is read out to I/O lines IOt/b. Thereafter, it is not illustrated in FIG. 21 but the data is outputted to the outside via the main amplifier and I/O section.

Now, the operation when precharge command PRE is entered is discussed. In the event that a precharge command is entered in the command entry wait state, the word line WL chosen is shifted to the word line standby level VWL when the selected word line WL is in the unselected state. In accordance with this, the sense amplifier activation signals φn, φp become the unselected state. After the sense amplifiers become the inactivated state, the bit line precharge signal φPC becomes the activated state, and all the bit lines BL and reference bit lines of activated memory cell arrays MCA are set to VDL/2 which is ½ of the bit line swing voltage. This completes the precharge operation.

Next discussion will be made on the write operation. FIG. 22 is a waveform drawing showing one example of the writing operation in DDR-SDRAM of FIG. 20. In FIG. 22, operations when active command ACT is entered and sense amplifiers are activated until the column command is entered are the same as the reading operation discussed above. The writing operation is carried out by simultaneously entering the write command WRIT and write address in the column command entry wait state. That is, there are cases in which the write command and write address are entered right after the active command as is the case of FIG. 22 or in which they are entered after the above-mentioned read command READ.

The write data is entered simultaneously with commands and addresses or at the edge of rising or trailing after one clock cycle time. The write data is entered from the I/O pin DQ and transferred to internal I/O lines IOt/b. The transferred data is written, by the column selection line YS chosen in accordance with the write destination entered together with the write command, in the sense amplifier circuit to which memory cell MC of the write address is connected.

In the sense amplifier, the bit line is driven and the data is written in the storage node SN of memory cell MC in accordance with the data written from the I/O lines IOt/b. Because in such event, to respective bit line pairs, memory cells MC are connected, 'L' data and 'H' data are written to two memory cells MC. When the write operation is completed, the semiconductor memory device becomes the column command entry wait state. The internal operation after the precharge command is entered is same as that discussed in the occasion of reading operation discussed above.

As described above, by using the semiconductor memory device according to embodiment 5, for example, effects as described as follows can be obtained.

Because in the present configuration, two memory cell transistors are equipped to one memory cell MC, the gate size can be made twice as large as that by the conventional technology, and increased read/write speeds and improved chip operating speed are enabled. Furthermore, by storing the complementary data in two memory cells MC, increased read speed can be achieved. Furthermore, because one bit is stored by the use of two memory cells MC, the read signal volume increases and high speed operation can be achieved. In addition, because information is stored by the use of two memory cells MC, the volume of electric charges which store 1 bit is large and the retention time can be extended.

The configurations and operations of present embodiment 5 are described with DDR-SDRAM taken for example, but the configurations and operations of the present invention can be applied to regular SDRAM or DDR2-SDRAM. Furthermore, the configuration of present embodiment 5 is desirably applied to a semiconductor memory device that adopts a process with the feature size not more than 0.13 µm where it becomes difficult to reduce the film thickness of gate oxide film of memory cell transistors and lowering of current drivability of memory transistor causes a problem.

Embodiment 6

In Embodiment 6, for the semiconductor memory devices equipped with a twin cell array system in which 1 bit is stored in two memory cells and with a system of address batch collective entry such as existing SRAM, the configuration and operations and others will be described with the case in which the memory cell array discussed in Embodiments 1 through 3 are applied used as an example.

FIG. 23 is a circuit diagram showing one example of configuration of the memory cell array and sense amplifier block with respect to the memory equipped with an address collective entry system and with a twin cell array system comprising the memory cell array according to embodiments 1 through 3 in the semiconductor memory device according to embodiment 6 of the present invention.

In FIG. 23, same as Embodiment 5, two bit lines (for example, BL0t/b) leading from the same memory cell array MCA as pair bit lines (first bit line pair) to the same sense amplifier circuit (first sense amplifier circuit). In this embodiment, the configurations of cross couple type amplifier CC and precharge circuit PC are the same those of Embodiment 5. However, common source lines NCS, PCS of the cross couple type amplifier CC (first cross couple type amplifier circuit) are not connected in common as shown in FIG. 23 and each individual cross-couple circuit is connected to sense amplifier drivers SAND, SAPD independently.

The write gate WG is a circuit block to write the data sent from the outside via I/O lines IO0t/b and IO1t/b to the sense amplifier and memory cell MC by the column selection line YS and low write mask signal RWM <0:1>. The read gate RG is a circuit block to output the data read from memory cell MC to sense amplifier to I/O lines IO0t/b, IO1t/b.

The read gate RG comprises two NMOS transistors (first transistor pair) whose gates are connected to, for example, pair bit lines such as BL0t/b and whose sources are connected in common; and two NMOS transistors (second transistor pair) whose respective sources are connected to respective drains of the NMOS transistors respectively, whose gates are connected to column selection signal YS, and whose drains are connected to IO lines IOt/b, respectively.

With respect to the read gate RG, in the present drawing, a differential amplifier system in which the bit lines BLt/b are connected to the gate as described above is taken, but this shall not be restricted to this. In addition, the read gate RG and the write gate WG are configured to be separated but the circuit configuration like IO gate IOG of embodiment 5 is acceptable. In addition, in the present drawing, it is implemented but as is the case of FIG. 20 described above, by inserting a shared gate SHR between the sense amplifier block SAB and memory cell array MCA, a configuration to share sense amplifier block SAB between adjacent memory cell arrays MCA is possible. By this, the configuration achieves an advantage to reduce the area of sense amplifier block SAB.

Next discusses is the operation of a semiconductor memory device of the present embodiment 6. FIG. 24 is a waveform diagram showing one example of the reading operation in memory equipped with the configuration of FIG. 23. In FIG. 24, a read command READ is entered in line with the rising edge of the clock CLK. In such event, combinations with a pin that indicates the read operation or with input signals are indicated by read/write control signals /RW, and when commands are entered, read/write control signals /RW indicate the read operation at 'H' and the write operation at 'L.'

In accordance with the addresses entered simultaneously with the read commands, in the sense amplifier block SAB of corresponding addresses, the bit line precharge signal φPC is changed to inactivated state. In this event, since the precharge circuit PC is configured by NMOS, the bit line precharge signal φPC changes from high potential level of the activated state (for example, word line charge pump power supply VWH or bit line swing voltage VDL) to ground level VSS. Due to this, precharge of bit lines BLt/b of corresponding memory cell array MCA is stopped.

Then, the word line WL that corresponds to the entered address is chosen. In such event, in the chosen word line WL, two word lines connected to one memory cell MC (for example, corresponds to two word lines WL that intersect WL0, WL1 of FIG. 2, BL0t/b in FIG. 23, etc.) are simultaneously activated. Or, in order to reduce the peak current of the word line charge pump power supply VWH, the activation timing of word lines WL0, WL1 may be off.

The activated word lines WL0, WL1 shift from the word line standby level VWL to word line selection level VWH. In response to this, in the memory cell MC, gates of two transistors are selected, storage node SN and bit lines BLt/b are connected, and the memory cell MC data is read to the bit lines BLt/b. Because in the present configuration, it is configured to connect the memory cell MC to both of the two bit lines BLt/b connected to the sense amplifier, for example, of bit line pairs BL0t/b, to either one of the bit lines BL0t, BL0b, the 'H' data is read without fail, and to the other, 'L' data is read, and the bit lines BL0t/b are driven high and low with respect to the precharge level VDL/2 before reading.

Almost simultaneously when the word line WL is activated, the column selection signal YS is activated. Simultaneously with it, in the read gate RG, a low read enable signal PRE which is the common source line of two NMOS transistors (first transistor pair) which receives bit lines BLt/b to the gate is shifted from high voltage level VDL or bit line precharge level VDL/2 to ground level VSS. By this, the gate receiving differential amplifier type read gate RG is activated. Because this gate receiving differential amplifier type read gate RG does not allow bit lines BLt/b to directly connect to I/O lines IO0t/b, IO1t/b, it is possible to output the data of bit lines BLt/b to I/O lines IO0t/b, IO1t/b before activating the sense amplifiers. By this, high-speed reading operation is enabled.

The data read out to I/O lines IO0t/b, IO1t/b is outputted to the outside via circuits of the peripheral circuit region or output buffer. Thereafter, after the word line WL is activated and a specified period passes, the NMOS sense amplifier activation signal ϕn is shifted from the ground level VSS of the unselected state to high potential VCL of the activated state (for example, bit line swing voltage VDL or word line voltage VWH, etc.), and NMOS cross couple is activated. Nearly simultaneously with this or slightly late, PMOS sense amplifier activation signal ϕp is shifted from high potential VCL of the unselected state (for example, bit line swing voltage VDL or word line voltage VWH, etc.) to ground level VSS of the activated state, and PMOS cross couple is activated. Due to this, microsignal voltage generated in bit lines BLt/b is amplified to the bit line swing voltage. Thus, to the two memory cells MC connected to bit lines BLt/b, respectively, the complementary data is rewritten.

After the word line WL is chosen and a specified period passes, the word line WL chosen is shifted to the word line standby level VWL when the selected word line WL is in the unselected state. In accordance with this, the sense amplifier activation signals ϕn, ϕp become the unselected state. After the sense amplifiers become the inactivated state, the bit line precharge signal ϕPC becomes the activated state, and all the bit lines BL and reference bit lines of activated memory cell arrays MCA are set to the bit line precharge level. In this drawing, the bit line precharge level is set to VDL/2 which is ½ of the bit line swing voltage. This completes the precharge operation.

Next discussion will be made on the write operation. FIG. 25 is a waveform diagram showing one example of the writing operation in memory equipped with the configuration of FIG. 23. In this configuration, an example is shown to carry out an operation to write the write data into the sense amplifiers before activating the sense amplifiers in order to shorten the write cycle time in line with the high-speed read operation discussed above.

In FIG. 25, a write command WRIT is entered in line with the rising edge of the clock CLK. In such event, combinations with a pin that indicates the write operation or with input signals are indicated by read/write control signals /RW, and when commands are entered, read/write control signals /RW indicate the read operation at 'H' and the write operation at 'L.'

In accordance with the addresses entered simultaneously with the write commands or the addresses held in an address buffer provided inside a chip, in the sense amplifier block SAB of corresponding addresses, the bit line precharge signal ϕPC is changed to inactivated state. In this event, since the precharge circuit PC is configured by NMOS transistor, the bit line precharge signal ϕPC changes from high potential level of the activated state (for example, word line charge pump power supply VWH or bit line swing voltage VDL) to ground level VSS. Thus, precharge of bit lines BLt/b of corresponding memory cell array MCA is stopped.

Then, the word line WL that corresponds to the entered address is chosen. In such event, in the chosen word line WL, two word lines connected to one memory cell MC (for example, corresponds to two word lines WL that intersect WL0, WL1 of FIG. 2, BL0t in FIG. 23, etc.) are simultaneously activated. Or, in order to reduce the peak current of the word line charge pump power supply VWH, the activation timing of word lines WL0, WL1 may be off. The activated word lines WL0, WL1 is shifted from the word line standby level VWL to word line selection level VWH.

Almost simultaneously when the word line WL is activated, by activating the column selection signal YS that corresponds to the input address and connecting the bit lines in the sense amplifier with I/O lines IO0t/b, IO1t/b, the write data is written to bit lines BLt/b. By this, 'H' and 'L' are stored in the storage node SN, respectively, in accordance with this write data, irrespective of the data of two memory cells MC which store 1-bit complementary data.

At the timing in which this writing is carried out, in the write unselected sense amplifier, gates of the two memory cell transistors of memory cell MC become the selected state, the storage node SN is connected to the bit line, and the data of memory cell MC is read. In such event, since the source nodes of adjacent cross couple type amplifier CC are separated by sense amplifier drivers SAND, SAPD which are turned OFF, malfunction caused by the write selection sense amplifier which drives sources of write-unselected sense amplifiers can be avoided. By this, it is possible to allow the stable read operation by write unselected sense amplifier and high-speed writing operation by the write-selected sense amplifier to stand together.

Thereafter, after the word line WL is activated and a specified period passes, the NMOS sense amplifier activation signal ϕn is shifted from the ground level VSS of the unselected state to high potential VCL of the activated state (for example, bit line swing voltage VDL or word line voltage VWH, etc.), and NMOS cross couple is activated. Nearly simultaneously with this or slightly late, PMOS sense amplifier activation signal ϕp is shifted from high potential VCL of the unselected state (for example, bit line swing voltage VDL or word line voltage VWH, etc.) to ground level VSS of the activated state, and PMOS cross couple is activated. By this, microsignal voltage generated in bit lines BL0t/b is amplified to the bit line swing voltage. By this, the data of bit lines in the sense amplifier is written to the memory cell MC.

After the word line is chosen and a specified period passes, the word line chosen is shifted to the word line standby level VWL when the selected word line is in the unselected state. In accordance with this, the sense amplifier activation signals φn, φp become the unselected state. After the sense amplifier becomes the inactivated state, the bit line precharge signal φPC becomes the activated state, and all the bit lines BL and reference bit lines of activated memory cell arrays MCA are set to the bit line precharge level. In this drawing, the bit line precharge level is set to VDL/2 which is ½ of the bit line swing voltage. This completes the precharge operation.

Referring now FIG. 26 and FIG. 27, the whole configuration and external operations of the semiconductor memory device of embodiment 6 will be discussed. FIG. 26 is a circuit block diagram showing part of block in the whole block configuration with respect to memory equipped with the address collective entry system and twin cell array system comprising the memory cell array according to embodiments 1 through 3 in the semiconductor memory device according to embodiment 6 of the present invention. FIG. 27 is a timing chart showing one example of the external operation in memory shown in FIG. 26.

The semiconductor memory device shown in FIG. 26 includes, for example, memory array MA equipped with a memory cell to store information; I/O control unit (I/O CTL) that controls I/O data to the memory array MA; low address decoder X-DEC and column address decoder Y-DEC which choose a memory cell that corresponds to the external address; address buffer 1, address compare circuit and multiplexer MUX which receive external input address A0-An, data mask DM, and read/write control signal /RW, etc.; data buffer 1 DIB, output buffer and multiplexer MUX which receive read/write control signal /RW, etc. and carry out processing to external I/O data DQ0-DQm; and others. And this memory array MA is equipped with the configuration as described in FIG. 23.

In the configuration of the present semiconductor memory device, by one read or write cycle, a case of 4-bit prefetch in which four data are entered and outputted per one I/O pin and furthermore to output this 4 bits as burst length 4 is assumed. This prefetch operation parallel-serial-converts and outputs to the outside 4-bit parallel data simultaneously read in accordance with the address. At the time of writing, reversal to this takes place, and the 4-bit serial data is parallel-converted and transmitted to memory array MA. The timing in the present configuration is assumed to be 2 clock cycles for the write/read cycle time and 1.5 clock cycles for the delay time from read command entry to read data output, but the present invention shall not be limited to this.

First of all, using FIG. 27, the write operation will be described. The data buffer 1 and address buffer 1 shall have been initialized. As soon as the write command W0 is entered, the corresponding address A00-A0n is entered. In the present operation, when the write operation is carried out, the write data W00-W03 are entered with 1 clock of the clock cycle delayed from this entered command. Write data W00-W03 and corresponding address A00-A0n are held in the data buffer 1 and address buffer 1 until the next write command is entered. Now, to invalidate the entered data, the data mask DM shall be entered and held in the address buffer 1.

When write command W1 is further entered in the subsequent cycle, write data W00-W03 and address A00-A0n, and data mask DM held in the data buffer 1 and the address buffer 1 are sent to the multiplexer MUX, and then from multiplexer MUX to low address decoder X-DEC, and then to column address decoder Y-DEC, where a specific address is chosen. Simultaneously, data W00-W03 held in the data buffer 1 is sent to the IO control section and written to the specific address of memory array MA. In such event, in accordance with the input information of data mask DM, low write mask signal RWM <1:0> of sense amplifier is driven, and the sense amplifier to be written is chosen. In such event, when the write mask is entered at the time of data entry, the low write mask signal RWM is not driven and write operation does not take place.

The write data W10-W13 entered in this cycle are held in the data buffer 1, and the corresponding addresses A10-A1n are transferred to the address buffer 1, where they are held until next write command is entered. Because holding the write data of the past one cycle in this way enables the write data to be transferred to the memory array MA as soon as the specific address is activated, the operation to write the write data to the sense amplifier before the sense amplifier is activated is enabled.

Now, the read operation is described. FIG. 27 indicates an example in which the read command R2 and address are entered after the write command W1. In such event, entered addresses A20-A2n are transferred to the address compare circuit and multiplexer MUX of FIG. 26, and compared with the address held n the address buffer 1.

In the event that the comparison results do not coincide, as shown in FIG. 27, a specific address of the memory array MA is activated, and the read data R20-R23 read from there are transferred to the output buffer and outputted to the outside. On the other hand, in the event that the results coincide, a coincidence signal HIT is activated and the data held in the data buffer 1 is transferred to the output buffer, and the data is outputted to the outside. The present embodiment 6 is preferably applied to a memory array with comparatively long cycle time in which the data I/O is finished in he cycle time.

As described above, by the use of the semiconductor memory device according to Embodiment 6, for example, the following effects can be obtained.

In the present configuration, a large gate size of memory cell transistor can be obtained without increasing the memory cell area, read action can be carried out at high speed. In addition, by storing 1 bit by the use of 2 cells, the data pattern dependence of read time can be reduced, the large timing margin is not longer required, and high-speed operation can be achieved. Furthermore, write operation can be carried out before sense amplifier is activated, and since the gate width of memory cell transistor is twice, even when the cycle time is shortened, sufficient write voltage can be secured for the memory cell storage node, and high-speed cycle operation can be achieved.

In addition, as shown in FIG. 26 and FIG. 27, by temporarily holding write data and address inside, data can be written on to the sense amplifier before activating the sense amplifier of the subsequent write cycle, and it has an advantage of securing sufficient write time.

Now, the invention made by the present inventors has been specifically described in terms of preferred embodiments, but needless to say, it is our intention that the invention be not limited by any of the details of description but various changes and modifications may be made in the invention without departing from the spirit and scope thereof.

For example, the present invention is not limited to a single DRAM but can be applied to memory embedded with computing unit. In the embedded memory, as compared to single memory, still greater high-speed operation is desired, and the present invention is suitable.

Furthermore, the semiconductor memory devices described in Embodiments 4 through 6 will become particularly useful when the voltage relationship falls under, for example, the following.

The external power supply voltage is preferably not more than 2.6V. The bit line swing voltage VDL is preferably kept to not more than 1.5V. By these, there are advantages in that the bit line charge and discharge current can be reduced and at the same time internal charge pump circuit is no longer required. The word line charge pump power supply VWH is preferably set to voltage about 1.7V higher than the bit line swing voltage. To reduce voltage for the word line charge pump power supply achieves advantages of improving the reliability of memory cell transistors and at the same time reducing the area of charge pump power supply circuit block.

The word line unselected voltage VWL is preferably set to the ground level or to about negative power supply −0.5V. By using the negative power supply, the word line charge pump power supply VWH can be reduced and at the same time, the sub-threshold leak current of memory cell transistors with the word line set in the unselected state can be reduced, the retention time can be improved, and reduction of standby electric power can be achieved.

As described above, by the inventions disclosed by the present application, carrying out read operation and write operation using two memory cell transistors for the same capacitor element improves the current drivability and high-speed operation can be achieved.

In addition, it is possible to achieve high-speed operation and at the same time increased integration by using a layout to alternately dispose the diffusion layer region to be connected to bit lines and the diffusion layer region to be connected to the capacitor on the active region of a continuous shape in the event that a memory cell array is built by this configuration using two memory cell transistors.

What is claimed is:

1. A semiconductor memory device comprising:
a bit line;
a first transistor and a second transistor disposed in the direction of the bit line extending;
a capacitor element which holds information;
the first transistor having a first node shared by a first node of the second transistor, wherein one end of the capacitor element connected in common to the shared node; and
a second node of the first transistor and a second node of the second transistor being connected independently to the bit line through contact respectively,
wherein the semiconductor memory device has a first word line connected to a gate of the first transistor, and a second word line disposed in parallel with the first word line and connected to a gate of the second transistor.

2. The semiconductor memory device according to claim 1, wherein the first word line and the second word line are simultaneously activated.

3. A semiconductor memory device comprising:
a bit line;
multiple first diffusion layer regions disposed in parallel with the bit line;
multiple second diffusion layer regions disposed one by one between relevant multiple first diffusion layer regions;
multiple first contacts that connect the first diffusion layer regions with the bit line;
multiple second contacts, each of the multiple second contacts disposed in the respective second diffusion layer regions;
multiple capacitors connected to the multiple second contacts, respectively; and
multiple word lines disposed one by one between the multiple first diffusion layer regions and the multiple second diffusion layer regions, respectively, and extending in the direction that intersects with the bit line,
wherein a portion of two adjacent word lines among the multiple word lines and one of the multiple capacitors configure one memory cell.

4. The semiconductor memory device according to claim 3, wherein
the bit line comprises multiple pieces,
the semiconductor memory device further comprising:
a memory cell array that includes the multiple bit lines and the multiple word lines and is equipped with a rectangular region comprising a first side, a second side, a third side, and a fourth side;
a first sense amplifier group provided along the first side;
a first word driver group provided along the second side;
a second sense amplifier group which shares one angle with the second side and is provided along the third side in parallel with the first side; and
a second word driver group that shares one angle with the first side and the third side, respectively, and provided along the fourth side in parallel with the second side;
wherein the plurality bit lines comprise multiple first bit lines connected to the first sense amplifier group and multiple second bit lines connected to the second sense amplifier group; and
wherein the multiple word lines comprise multiple first word lines connected to the first word driver group and multiple second word lines connected to the second word driver group.

5. The semiconductor memory device according to claim 4, wherein
the first sense amplifier group comprises multiple first sense amplifier circuits, and to the first sense amplifier circuit, the first bit line pair comprising two first bit lines is connected.

6. The semiconductor memory device according to claim 5, wherein
the first sense amplifier circuit comprises:
a pair of first transistors have a gate, source and drain respectively, wherein each of the gates is connected to each bit line of the first bit line pair and the sources are connected in common, and
a pair of second transistors have a source, gate and drain respectively, wherein each of the sources is connected to each drain of the pair of first transistors, and column selection signal is entered in the gates and outputted from the drains.

7. The semiconductor memory device according to claim 4, wherein the second contact is disposed between the first word line and the second word line.

8. The semiconductor memory device according to claim 7, wherein the first word line and the second word line are disposed alternately in the memory cell array.

9. The semiconductor memory device according to claim 7, wherein the first word line and the second word line are disposed two lines apart in the memory cell array.

10. The semiconductor memory device according to claim 8, wherein the first word line and the second word line are connected in common at the boundary of the memory cell array.

11. The semiconductor memory device according to claim 4, wherein
the first word line and the second word line are disposed two lines apart in the memory cell array, and
the second contact is disposed between adjacent two first word lines and between adjacent two second word lines.

12. The semiconductor memory device according to claim 11, wherein
the adjacent two first word lines are connected to the first word driver group at the boundary of the memory cell array, and
the adjacent two second word lines are connected to the second word driver group at the boundary of the memory cell array.

13. The semiconductor memory device according to claim 4, wherein
multiple memory cell transistors are formed by the multiple first diffusion layer regions, the multiple second diffusion layer regions, and the multiple word lines,
a substrate region of the multiple memory cell transistors are connected to a substrate region of the first sense amplifier group, and
the voltage of the substrate region of the multiple memory cell transistors is supplied from the substrate region of the first sense amplifier group.

14. The semiconductor memory device according to claim 3, wherein the multiple capacitors are disposed on the upper layer of the bit line.

15. The semiconductor memory device according to claim 3, wherein the multiple capacitors are disposed on the lower layer of the bit line.

16. A semiconductor memory device comprising:
a bit line;
multiple transistors, each of the multiple transistors equipped with a current path in the direction parallel to the bit line and equipped with a first and second diffusion layer regions;
multiple word lines, each of the multiple word lines crossing with the bit line and being a gate of each of the multiple transistors;
multiple capacitors that store information;
multiple first contacts, each of the multiple first contacts connecting the respective first diffusion layer regions with the bit line;
multiple second contacts, each of the multiple second contacts connecting the second diffusion layer regions with each of the multiple capacitors, respectively;
each of the first contacts and each of the second contacts being alternately arranged in the direction parallel to the bit line,
wherein each of the multiple capacitors has a first electrode and a second electrode, the first electrode connects to each of the second contacts, and the second electrodes of the multiple capacitors connect to each other.

17. The semiconductor memory device according to claim 16, wherein the
multiple capacitors are disposed on the lower layer of the bit line.

18. A semiconductor memory device comprising:
multiple bit lines;
multiple capacitors that store information;
multiple word line pairs that extend in the direction to intersect with the multiple bit lines and disposed in plural sets of two lines in the direction in which multiple bit lines extend;
multiple active regions disposed in parallel to the multiple bit lines, respectively and equipped with a shape continuing in the direction in which the multiple bit lines extend;
multiple second diffusion layer regions formed between two word lines included in the multiple word line pairs, respectively, and in the vicinity of the intersection with multiple active regions;
multiple first diffusion layer regions formed between the multiple word line pairs and in the vicinity of the intersection with the multiple active regions;
multiple first contacts connected to multiple bit lines, respectively, and formed in the multiple first diffusion layer regions, respectively; and
multiple second contacts connected to multiple capacitors, respectively, and formed in the multiple second diffusion layer regions, respectively.

19. The semiconductor memory device according to claim 18, wherein
each of the multiple active regions is equipped with a triangular wave shape that continues in the direction in which the multiple bit lines extend, and
each of the multiple bit lines is equipped with a shape axisymmetrical to each of the triangular wave shapes in the multiple active regions with the direction in which the multiple bit lines extend used as an axis.

20. A semiconductor memory device, comprising:
a bit line;
multiple first diffusion layer regions disposed in parallel with the bit line;
multiple second diffusion layer regions disposed one by one between relevant multiple first diffusion layer regions;
multiple first contacts that connect the first diffusion layer regions with the bit line;
multiple second contacts, each of the multiple second contacts disposed in the respective second diffusion layer regions;
multiple capacitors connected to multiple second contacts, respectively; and
multiple word lines disposed one by one between the multiple first diffusion layer regions and the multiple second diffusion layer regions, respectively, and extending in the direction that intersects with the bit line, wherein
the bit line comprises multiple pieces,
on one side of the multiple word lines, a first contact row comprising the multiple first contacts are disposed in the direction in which the multiple word lines extend,
on the other side of the multiple word lines, a second contact row comprising the multiple second contacts are disposed in the direction in which the multiple word lines extend, and the first contact row and the second contact row have the same number of contacts.

21. A semiconductor memory device comprising:
a bit line;
multiple first diffusion layer regions disposed in parallel with the bit line;
multiple second diffusion layer regions disposed one by one between relevant multiple first diffusion layer regions;
multiple first contacts that connect the first diffusion layer regions with the bit line;
multiple second contacts, each of the multiple second contacts disposed in the respective second diffusion layer regions;
multiple capacitors connected to the multiple second contacts, respectively; and
multiple word lines disposed one by one between the multiple first diffusion layer regions and the multiple second diffusion layer regions, respectively, and extending in the direction that intersects with the bit line,
wherein a portion of two adjacent word lines among the multiple word lines and one of the multiple capacitors configure one memory cell, wherein
the bit line comprises multiple pieces,
on one side of the multiple word lines, a first contact row comprising the multiple first contacts are disposed in the direction in which the multiple word lines extend,
on the other side of the multiple word lines, a second contact row comprising the multiple second contacts are disposed in the direction in which the multiple word lines extend, and
the first contact row and the second contact row have the same number of contacts.

* * * * *